United States Patent
Masuyama et al.

(10) Patent No.: US 9,823,392 B2
(45) Date of Patent: Nov. 21, 2017

(54) OPTICAL SUBSTRATE, MOLD TO BE USED IN OPTICAL SUBSTRATE MANUFACTURE, AND LIGHT EMITTING ELEMENT INCLUDING OPTICAL SUBSTRATE

(71) Applicant: JX NIPPON OIL & ENERGY CORPORATION, Tokyo (JP)

(72) Inventors: Satoshi Masuyama, Tokyo (JP); Takashi Seki, Tokyo (JP); Maki Fukuda, Tokyo (JP); Suzushi Nishimura, Tokyo (JP)

(73) Assignee: JX NIPPON OIL & ENERGY CORPORATION, Tokyo (JP)

( * ) Notice: Subject to any disclaimer, the term of this patent is extended or adjusted under 35 U.S.C. 154(b) by 0 days.

(21) Appl. No.: 15/109,581

(22) PCT Filed: Dec. 17, 2014

(86) PCT No.: PCT/JP2014/083388
§ 371 (c)(1),
(2) Date: Jul. 1, 2016

(87) PCT Pub. No.: WO2015/104968
PCT Pub. Date: Jul. 16, 2015

(65) Prior Publication Data
US 2016/0327695 A1     Nov. 10, 2016

(30) Foreign Application Priority Data

Jan. 10, 2014   (JP) .................................. 2014-003211

(51) Int. Cl.
*H01L 29/08*     (2006.01)
*H01L 29/04*     (2006.01)
(Continued)

(52) U.S. Cl.
CPC ........ *G02B 5/0221* (2013.01); *B29C 33/3842* (2013.01); *B29C 33/424* (2013.01);
(Continued)

(58) Field of Classification Search
CPC . H01L 51/096; H01L 51/5262; G02B 5/0221; G02B 5/0278; B29C 33/3842;
(Continued)

(56) References Cited

U.S. PATENT DOCUMENTS

| | | | |
|---|---|---|---|
| 2011/0180127 A1* | 7/2011 | Wan ...................... | B82Y 10/00 |
| | | | 136/252 |
| 2012/0132897 A1* | 5/2012 | Seki ..................... | G02B 5/1809 |
| | | | 257/40 |

(Continued)

FOREIGN PATENT DOCUMENTS

| | | |
|---|---|---|
| CN | 102472847 A | 5/2012 |
| JP | 2000-321568 A | 11/2000 |

(Continued)

OTHER PUBLICATIONS

Jul. 21, 2016 International Preliminary Report on Patentability issued in International Patent Application No. PCT/JP2014/083388.
(Continued)

*Primary Examiner* — Dzung Tran
(74) *Attorney, Agent, or Firm* — Oliff PLC

(57) ABSTRACT

An optical substrate according to one embodiment includes a support substrate, and a projection-depression structure layer on a surface of which shapes of projections and depressions are formed, the projection-depression structure layer being laminated on the support substrate. The extending directions of projection portions contained in the projection-depression structure layer are irregularly distributed seen in planar view. An outline seen in planar view of a projection portion contained in a region per unit area of the (Continued)

projection-depression structure layer includes more straight line sections than curved line sections.

8 Claims, 16 Drawing Sheets

(51) Int. Cl.
| | |
|---|---|
| *H01L 31/102* | (2006.01) |
| *G02B 5/02* | (2006.01) |
| *H01L 51/00* | (2006.01) |
| *H01L 51/52* | (2006.01) |
| *B29C 33/38* | (2006.01) |
| *B29C 33/42* | (2006.01) |
| *B29D 11/00* | (2006.01) |
| *B29L 11/00* | (2006.01) |
| *B29L 31/00* | (2006.01) |

(52) U.S. Cl.
CPC .... *B29D 11/0073* (2013.01); *B29D 11/00884* (2013.01); *G02B 5/0278* (2013.01); *H01L 51/0096* (2013.01); *H01L 51/5262* (2013.01); *B29L 2011/00* (2013.01); *B29L 2031/757* (2013.01); *Y02E 10/549* (2013.01); *Y02P 70/521* (2015.11)

(58) Field of Classification Search
CPC .............. B29C 33/424; B29D 11/0073; B29D 11/00884; Y02P 70/521; B29L 2011/00; B29L 2031/757; Y02E 10/549
USPC ................ 257/40, 59, 184; 438/71
See application file for complete search history.

(56) References Cited

U.S. PATENT DOCUMENTS

| | | | |
|---|---|---|---|
| 2012/0187435 A1* | 7/2012 | Gy ...................... | C03C 17/3411 257/98 |
| 2012/0286258 A1* | 11/2012 | Naraoka ................ | C09K 11/06 257/40 |
| 2013/0019936 A1* | 1/2013 | Hsieh .................... | H01L 51/447 136/256 |
| 2013/0186467 A1* | 7/2013 | Saeki .................... | B29C 33/424 136/259 |
| 2014/0306213 A1* | 10/2014 | Sato .................... | H01L 51/5275 257/40 |

FOREIGN PATENT DOCUMENTS

| | | |
|---|---|---|
| JP | 2009-021089 A | 1/2009 |
| JP | 2013-127844 A | 6/2013 |
| KR | 2013-0098564 A | 9/2013 |
| TW | 538279 B | 6/2003 |
| WO | 2011/007878 A1 | 1/2011 |
| WO | 2012/133414 A1 | 10/2012 |
| WO | 2013/001891 A1 | 1/2013 |
| WO | 2013/187149 A1 | 12/2013 |

OTHER PUBLICATIONS

Mar. 24, 2015 International Search Report issued in International Patent Application No. PCT/JP2014/083388.

* cited by examiner

*Fig.1*
(a)
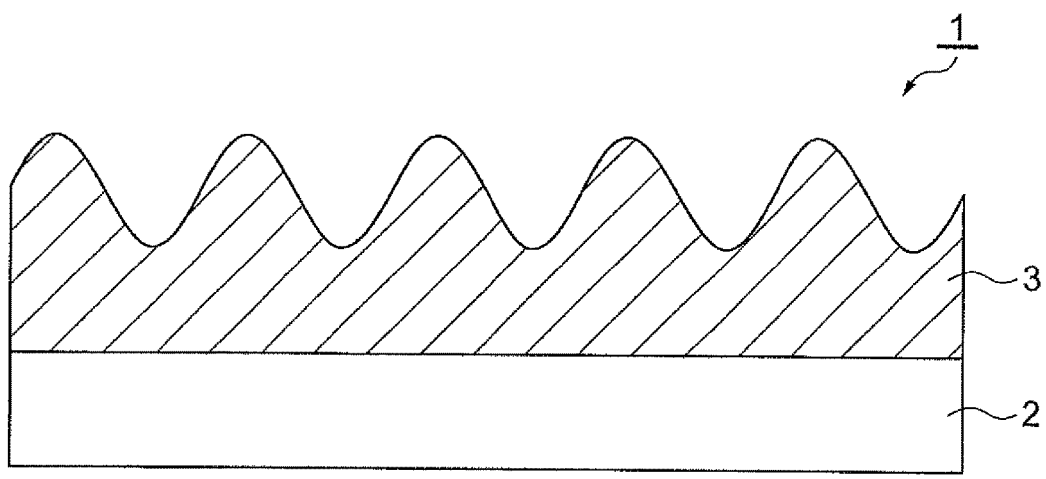
(b)
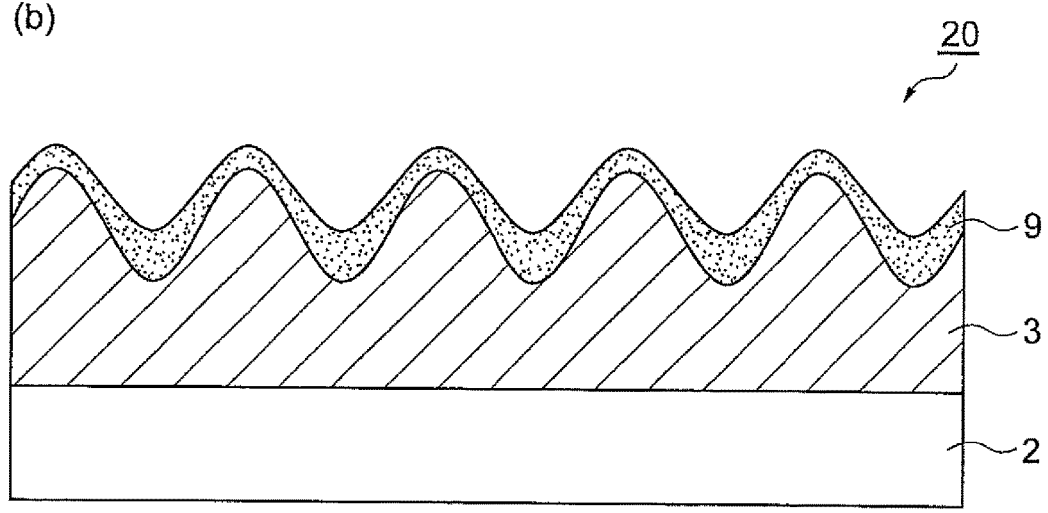

*Fig. 3*
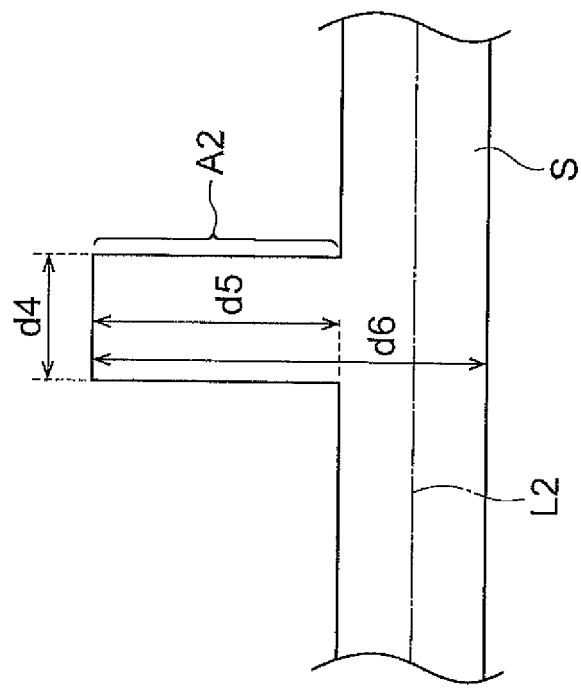
(b)
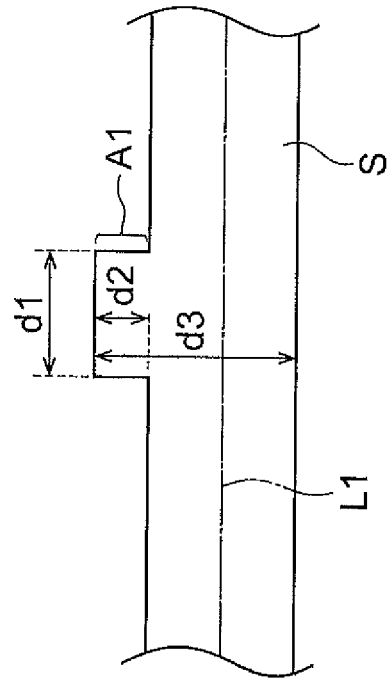
(a)

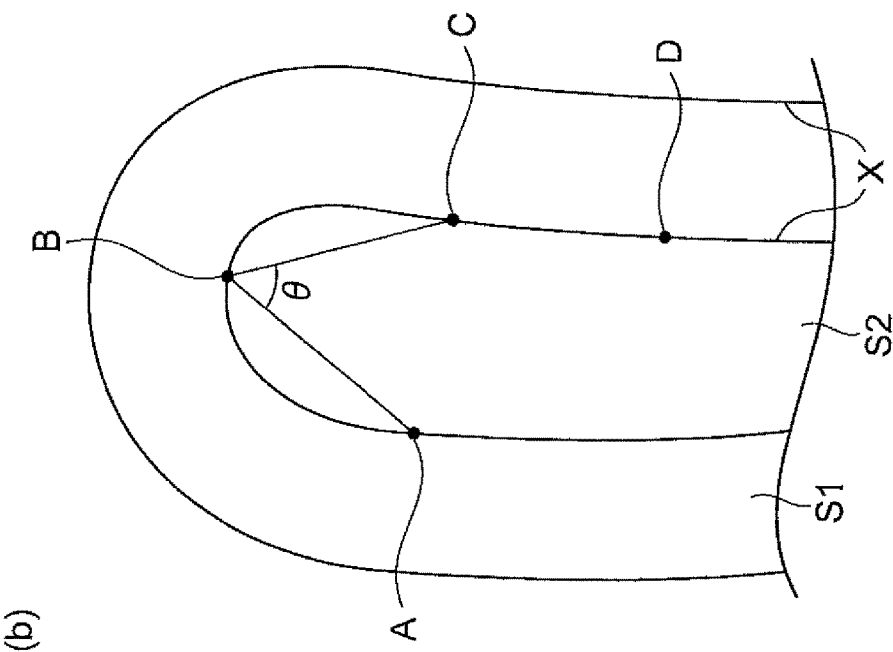
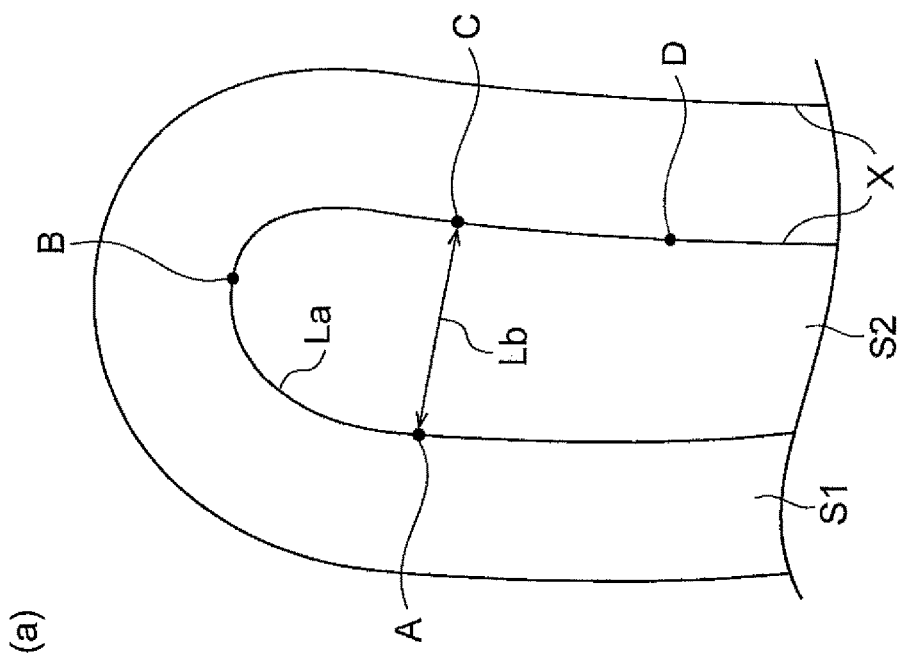
Fig. 5

Fig.8
(a)
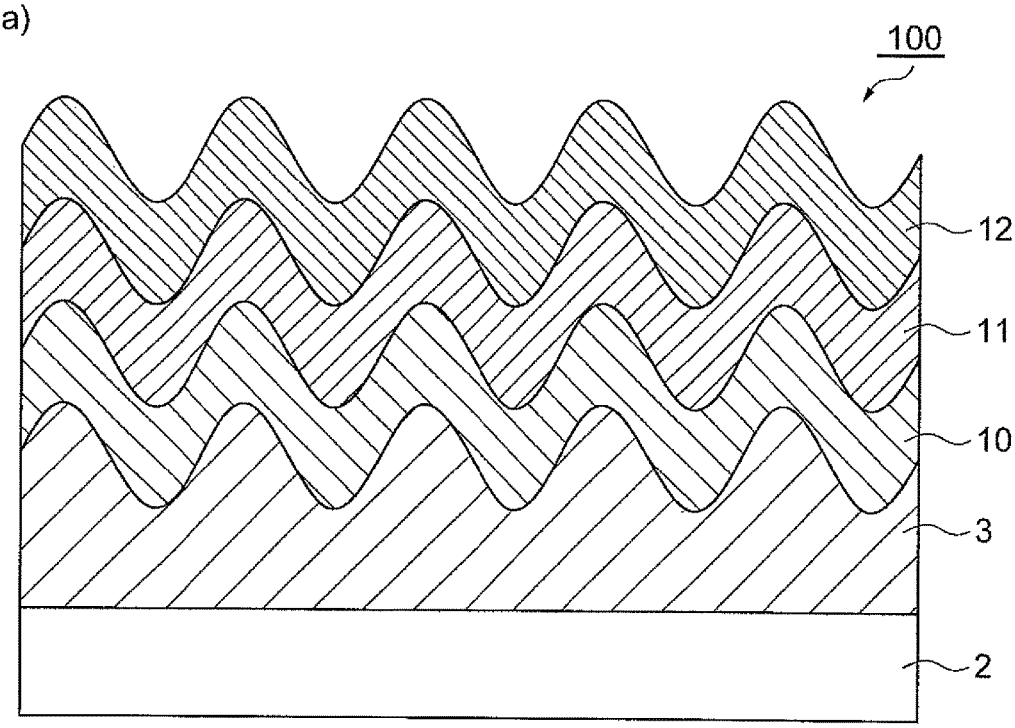
(b)
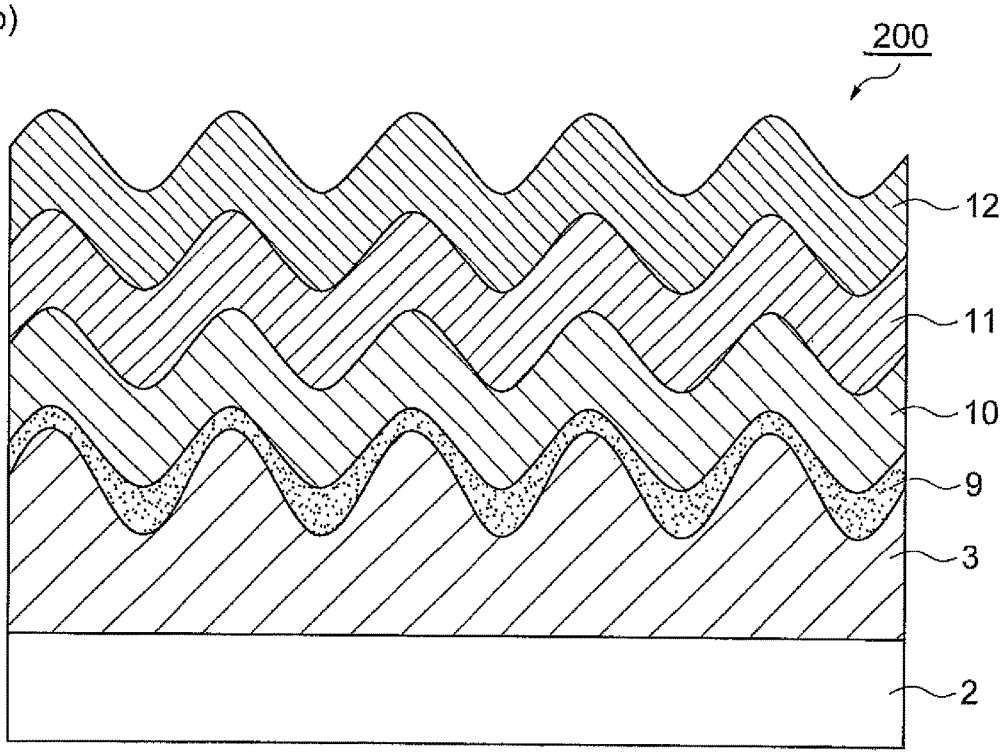

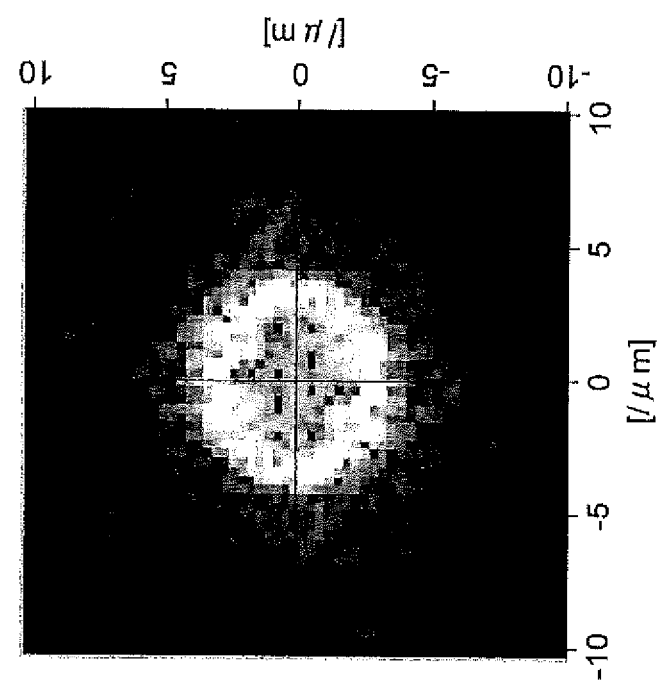
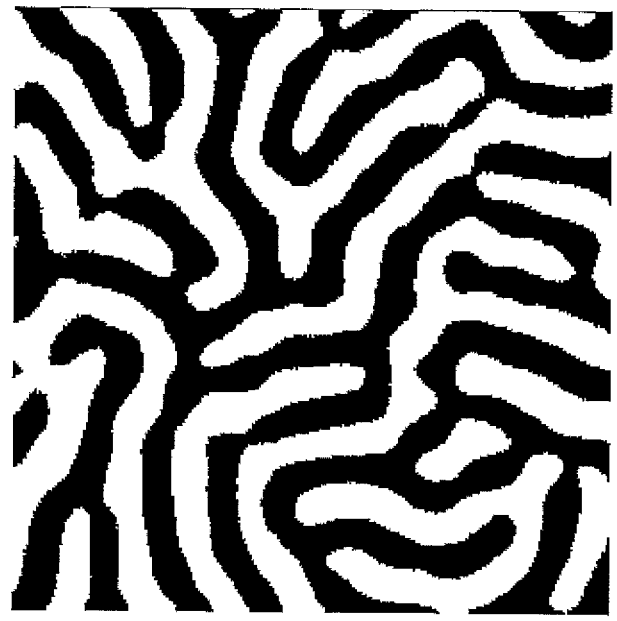
Fig. 10

Fig.11
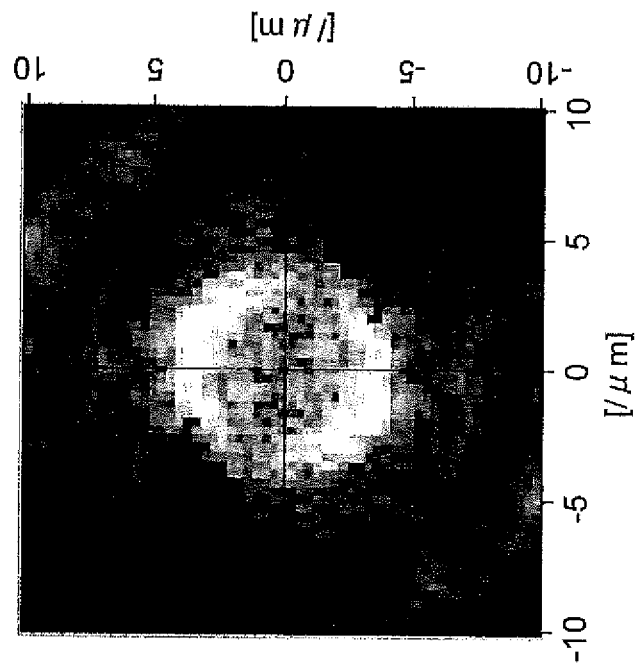
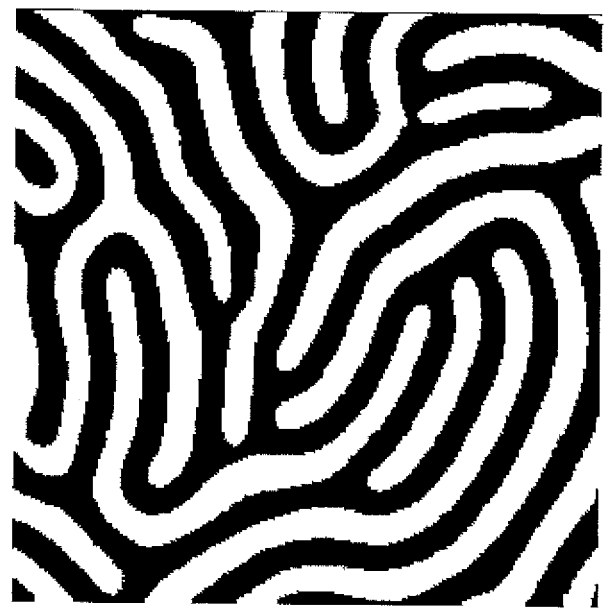

Fig. 12
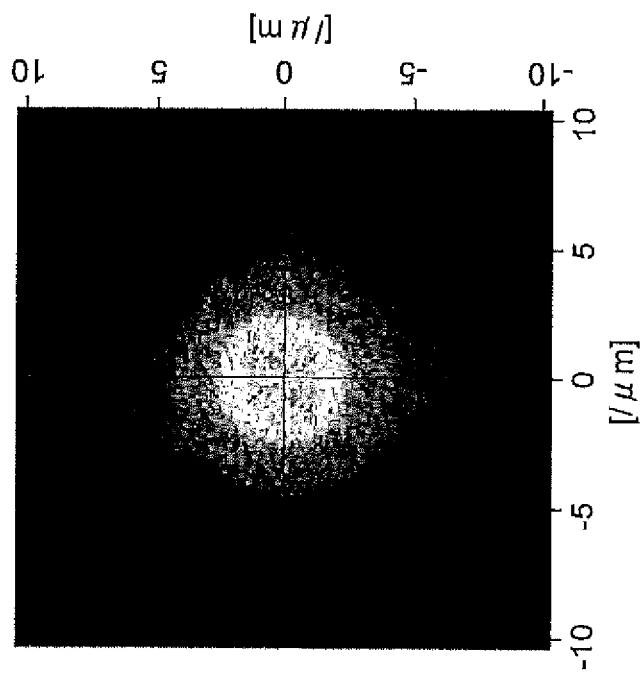
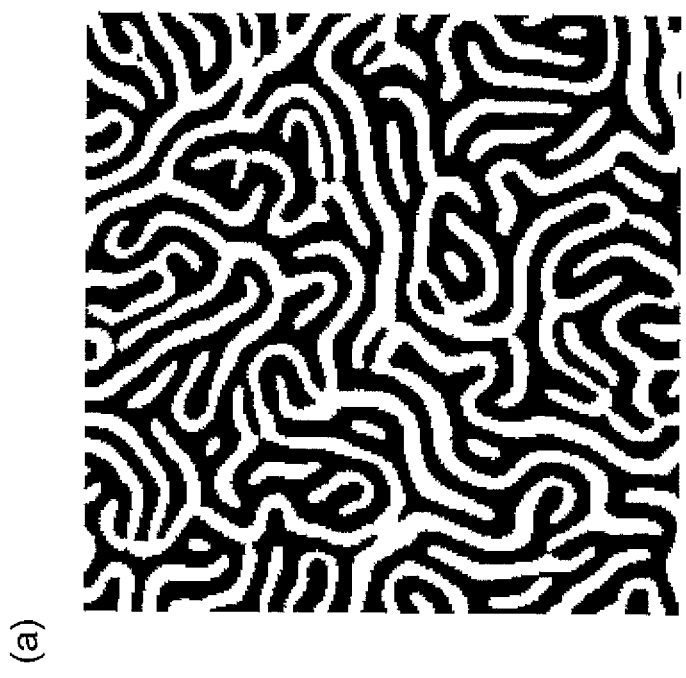

Fig.14
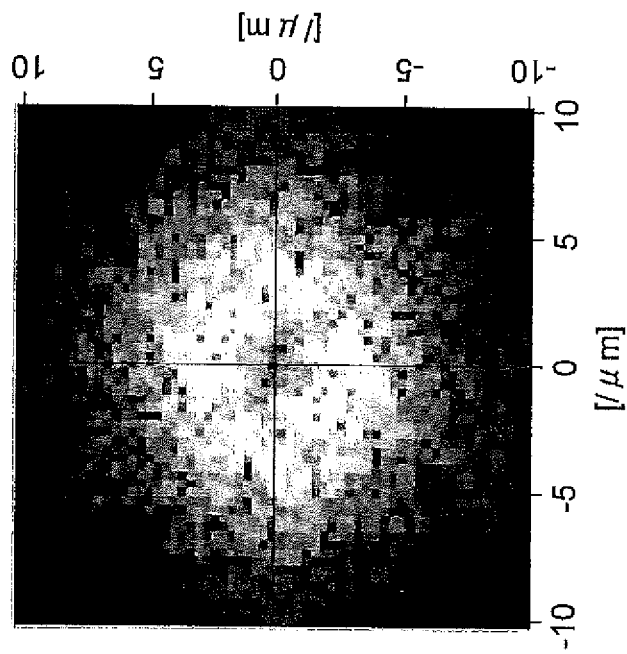
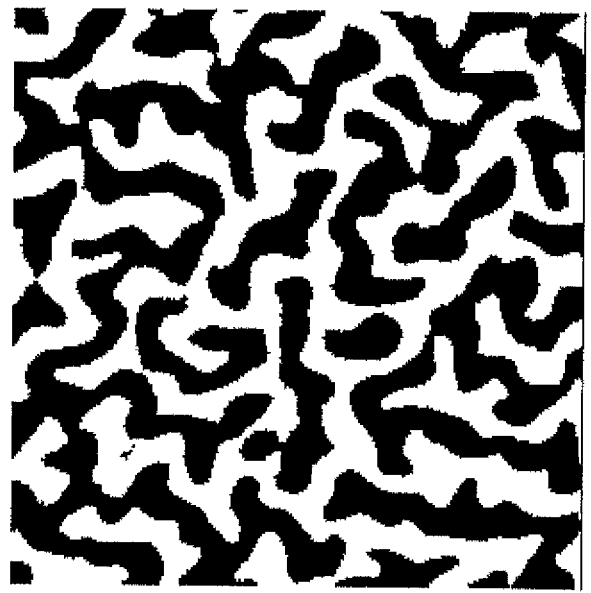

Fig.16

| | Boundary condition | Comparative Example 1 | Example 1 | Example 2 | Example 3 | Comparative Example 2 | Example 4 |
|---|---|---|---|---|---|---|---|
| Average of widths of projection portion(nm) | | 146.3 | 162.5 | 148.8 | 251.2 | 396.7 | 370.9 |
| Standard deviation of width of projection portion(nm) | | 51.4 | 24.4 | 15.8 | 48.8 | 127.0 | 54.5 |
| Coefficient of variation of width of projection portion | 0.25 | 0.35 | 0.15 | 0.11 | 0.19 | 0.32 | 0.15 |
| Length of one side of measurement region(nm) | | 3000 | 3000 | 3000 | 10000 | 10000 | 10000 |
| Proportion of straight line section in first definition method(%) | 50% | 47.4 | 84.0 | 88.4 | 76.2 | 48.3 | 78.5 |
| Proportion of straight line section in second definition method(%) | 70% | 56.8 | 92.5 | 92.2 | 81.2 | 59.6 | 79.7 |
| Standard deviation of depth between projection and depression(nm) | | 19.8 | 20.2 | 31.7 | 29.7 | 45.7 | 46.7 |
| Current efficiency | | C | B | A | A | B | A |
| Leak current | | B | A | A | A | B | A |

OPTICAL SUBSTRATE, MOLD TO BE USED IN OPTICAL SUBSTRATE MANUFACTURE, AND LIGHT EMITTING ELEMENT INCLUDING OPTICAL SUBSTRATE

TECHNICAL FIELD

The present invention relates to an optical substrate having shapes of projections and depressions formed on the surface thereof, a mold to be used in manufacturing of the optical substrate, and a light emitting element including the optical substrate.

BACKGROUND ART

Organic electroluminescent elements (organic EL elements) used in image display devices such as displays and planer light sources are known in the related art. In these organic EL elements, holes entering from an anode through a hole injection layer and electrons entering from a cathode through the electron injection layer are each transported to a light emitting layer. The holes and the electrons transported to the light emitting layer are then recombined on an organic molecule in the light emitting layer to excite the organic molecule. Light is thereby emitted. To use these organic EL elements in display devices and lighting devices, leak current should be reduced, and in addition, the light from the light emitting layer should be efficiently extracted from the surfaces of the organic EL elements.

Patent Literature 1 below discloses an organic electroluminescent element composed of a laminate containing a base layer and an organic electroluminescent layer, wherein the heated base layer is thermally shrunk to form shapes of projections and depressions on the surface of the base layer and thus form shapes of projections and depressions in the organic electroluminescent layer corresponding to the shapes of projections and depressions on the surface of the base layer. Patent Literature 1 describes that out-coupling efficiency is increased by the shapes of projections and depressions formed on these layers.

CITATION LIST

Patent Literature

Patent Literature 1: Japanese Unexamined Patent Publication No. 2009-021089

SUMMARY OF INVENTION

Technical Problem

However, in some patterns of the shapes of projections and depressions leak current may be readily caused, and sufficient light emission efficiency (current efficiency) may not be obtained. In this technical field, an optical substrate having enhanced light emission efficiency, a mold to be used in manufacturing of the optical substrate, and a light emitting element including the optical substrate have been desired.

Solution to Problem

The optical substrate according to one aspect of the present invention is an optical substrate comprising a support substrate, and a projection-depression structure layer on a surface of which shapes of projections and depressions are formed, the projection-depression structure layer being laminated on the support substrate, wherein extending directions of projection portions contained in the projection-depression structure layer are irregularly distributed seen in planar view, and outlines seen in planar view of the projection portions included in a region per unit area of the projection-depression structure layer include more straight line sections than curved line sections.

In one embodiment, widths of the projection portions in directions approximately orthogonal to the extending directions of the projection portions seen in planar view may be constant.

In one embodiment, the curved line section is a section in which a ratio of a linear distance between both ends of the section to a length of an outline between both ends of the section is 0.75 or less where a plurality of sections is formed by dividing the outline of a projection portion seen in planar view by the length of the average of the widths of the projection portion multiplied by a factor of π (circular constant), and the straight line section may be a section which is not the curved line section among the plurality of sections.

In one embodiment, the curved line section is a section in which among two angles formed by a line segment connecting one end of the section and a midpoint of the section and a line segment connecting the other end of the section and the midpoint of the section, an angle of 180° or less is an angle of 120° or less, where a plurality of sections is formed by dividing the outline of a projection portion seen in planar view by the length of the average of the widths of the projection portion multiplied by a factor of π (circular constant), and the straight line section is a section which is not the curved line section among the plurality of sections, and a proportion of the straight line section may be 70% or more of the plurality of sections.

The optical substrate according to another aspect of the present invention is an optical substrate comprising a support substrate, and a projection-depression structure layer on a surface of which shapes of projections and depressions are formed, the projection-depression structure layer being laminated on the support substrate, wherein extending directions of projection portions included in the shapes of projections and depressions are irregularly distributed seen in planar view, and widths of the projection portions in directions approximately orthogonal to the extending directions of the projection portions seen in planar view are constant.

In one embodiment, in cases where an analyzed image of projections and depressions obtained through analysis of shapes of projections and depressions formed on the surface of the projection-depression structure layer with a scanning probe microscope is subjected to two-dimensional high-speed Fourier transformation to obtain a Fourier transformed image, the Fourier transformed image shows a circular pattern or an annular pattern in which an origin having an absolute value of a wavenumber of $0\ \mu m^{-1}$ is approximately in the center, and the circular pattern or the annular pattern may be present within a region having an absolute value of a wavenumber within the range of $10\ \mu m^{-1}$ or less.

In one embodiment, an average pitch of projections and depressions of the projection-depression structure layer is 100 to 1500 nm, and a standard deviation of the depth between a projection and a depression of the projection-depression structure layer may be 10 to 100 nm.

In one embodiment, an optical functional layer formed on a surface of the support substrate opposite to a surface of the support substrate on which the projection-depression structure layer is formed may be further comprised.

In one embodiment, a coating layer formed on the projection-depression structure layer may be further comprised.

The mold according to another aspect of the present invention is a mold used in manufacturing of the optical substrate, and includes a projection-depression portion in which a projection-depression pattern corresponding to shapes of projections and depressions to be formed on the projection-depression structure layer of the optical substrate is formed.

The light emitting element according to another aspect of the present invention is a light emitting element including the optical substrate, wherein a first electrode, an organic layer which emits light, and a second electrode are sequentially laminated on the projection-depression structure layer.

Advantageous Effect of Invention

According to a variety of aspects and embodiments of the present invention, an optical substrate which can reduce generation of leak current and enhances light emission efficiency, an mold to be used in manufacturing of the optical substrate, and a light emitting element including the optical substrate can be provided.

BRIEF DESCRIPTION OF DRAWINGS

FIG. 1 is a sectional view schematically illustrating an optical substrate according to one embodiment.

FIG. 3 is a diagram for illustrating an example of a method of determining a branching of a projection portion in the analyzed image seen in planar view.

FIG. 5(a) is a diagram used for illustrating a first method of defining a curved line section, and FIG. 5(b) is a diagram used for illustrating a second method of defining a curved line section.

FIG. 8 is a sectional view schematically illustrating an organic EL element using the optical substrate according to the present embodiment as a diffraction grating substrate.

FIG. 10(a) is an analyzed image seen in planar view of the surface of a projection-depression structure layer in the optical substrate according to Example 1, and FIG. 10(b) is a diagram illustrating an FFT image thereof.

FIG. 11(a) is an analyzed image seen in planar view of the surface of a projection-depression structure layer in the optical substrate according to Example 2, and FIG. 11(b) is a diagram illustrating an FFT image thereof.

FIG. 12(a) is an analyzed image seen in planar view of the surface of a projection-depression structure layer in the optical substrate according to Example 3, and FIG. 12(b) is a diagram illustrating an FFT image thereof.

FIG. 14(a) is an analyzed image seen in planar view of the surface of a projection-depression structure layer in the optical substrate according to Comparative Example 1, and FIG. 14(b) is a diagram illustrating an FFT image thereof.

FIG. 16 is a table showing a variety of measurement values related to the optical substrates according to Examples 1 to 4 and Comparative Examples 1 and 2 thereof.

DESCRIPTION OF EMBODIMENTS

Figure 2:
FIG. 2 is a diagram illustrating an example of an analyzed image seen in planar view of a measured region of the optical substrate according to the present embodiment.

Hereinafter, embodiments will be described with reference to the drawings. If possible, the same reference numerals will be given to the same components and portions, and duplicated description will be omitted.

[Optical Substrate]

(a) of FIG. 1 is a sectional view schematically illustrating an optical substrate 1 according to one embodiment. As illustrated in (a) of FIG. 1, the optical substrate 1 according to the present embodiment comprises a support substrate 2, and a projection-depression structure layer 3 on a surface of which shapes of projections and depressions are formed, the projection-depression structure layer being laminated on the support substrate 2.

As the support substrate 2, a substrate composed of an inorganic material such as glass, quartz, or a silicon substrate; a resin substrate composed of polyethylene terephthalate (PET), polyethylene naphthalate (PEN), polycarbonate (PC), cycloolefin polymer (COP), polymethyl methacrylate (PMMA), polystyrene (PS), polyimide (PI), polyarylate, or the like; and a composite substrate of an inorganic material and a resin material to enhance gas barrier properties may be used, for example. Alternatively, for example, gallium arsenic, sapphire, silicon, silicon nitride, silicon carbide, and zinc oxide can also be used for the support substrate 2. The support substrate 2 may be transparent or may be opaque.

The support substrate 2 may be surface treated, or an adhesive layer may be disposed on the support substrate 2 to enhance adhesion. Moreover, a gas barrier layer may be disposed on the support substrate 2 to prevent invasion of moisture or a gas such as oxygen. Moreover, the support substrate 2 may have a lens structure having a variety of optical functions, such as convergence of light and diffusion of light, and other optical functional layers having a variety of optical functions, such as convergence of light and diffusion of light, formed on the surface opposite to the surface on which the projection-depression structure layer is formed.

For the projection-depression structure layer 3, sol gel materials such as silica, Ti-based materials, ITO (indium-tin-oxide)-based materials, ZnO, $ZrO_2$, and $Al_2O_3$ can be used, for example. For example, in the case where a projection-depression structure layer 3 composed of silica is formed on the support substrate 2 by a sol-gel method, a sol gel material of a metal alkoxide (silica precursor) is prepared as an undercoat material. As the precursor of silica, tetraalkoxide monomers such as tetraalkoxysilanes such as tetramethoxysilane (TMOS), tetraethoxysilane (TEOS), tetra-i-propoxysilane, tetra-n-propoxysilane, tetra-i-butoxysilane, tetra-n-butoxysilane, tetra-sec-butoxysilane, and tetra-t-butoxysilane; trialkoxide monomers such as trialkoxysilanes such as methyltrimethoxysilane, ethyltrimethoxysilane, propyltrimethoxysilane, isopropyltrimethoxysilane, phenyltrimethoxysilane, methyltriethoxysilane, ethyltriethoxysilane, propyltriethoxysilane, isopropyltriethoxysilane, phenyltriethoxysilane, methyltripropoxysilane, ethyltripropoxysilane, propyltripropoxysilane, isopropyltripropoxysilane, phenyltripropoxysilane, methyltriisopropoxysilane, ethyltriisopropoxysilane, propyltriisopropoxysilane, isopropyltriisopropoxysilane, phenyltriisopropoxysilane, and tolyltriethoxysilane; and dialkoxide monomers such as dialkoxysilanes such as dimethyldimethoxysilane, dimethyldiethoxysilane, dimethyldipropoxysilane, dimethyldiisopropoxysilane, dimethyldi-n-butoxysilane, dimethyldi-i-butoxysilane, dimethyldi-sec-butoxysilane, dimethyldi-t-butoxysilane, diethyldimethoxysilane, diethyldiethoxysilane, diethyldipropoxysilane, diethyldiisopropoxysilane, diethyldi-n-butoxysilane, diethyldi-i-butoxysilane, diethyldi-sec-butoxysilane, diethyldi-t-butoxysilane, dipropyldimethoxysilane, dipropyldiethoxysilane, dipropyldipropoxysilane, dipropyldiisopropoxysilane, dipropyldi-n-butoxysilane, dipropyldi-i-butoxysilane, dipropyldi-sec-butoxysilane, dipropyldi-t-butoxysilane, diisopropyldimethoxysilane, diisopropyldiethoxysilane, diisopropyldipropoxysilane, diisopropyldiisopropoxysilane, diisopropyldi-n-butoxysilane, diisopropyldi-i-butoxysilane, diisopropyldi-sec-butoxysilane, diisopropyldi-t-butoxysilane, diphenyldimethoxysilane, diphenyldiethoxysilane, diphenyldipropoxysilane, diphenyldiisopropoxysilane, diphenyldi-n-butoxysilane, diphenyldi-i-butoxysilane, diphenyldi-sec-butoxysilane, and diphenyldi-t-butoxysilane can be used. Furthermore, alkyltrialkoxysilanes and dialkyldialkoxysilanes containing alkyl groups having carbon atoms $C_4$ to $C_{18}$ can also be used. Metal alkoxides such as monomers having a vinyl group such as vinyltrimethoxysilane and vinyltriethoxysilane; monomers having an epoxy group such as epoxycyclohexyl)ethyltrimethoxysilane, 3-glycidoxypropylmethyldimethoxysilane, 3-glycidoxypropyltrimethoxysilane, 3-glycidoxypropyl methyldiethoxysilane, and 3-glycidoxypropyltriethoxysilane; monomers having a styryl group such as p-styryltrimethoxysilane; monomers having a methacrylic group such as 3-methacryloxypropylmethyldimethoxysilane, 3-methacryloxypropyltrimethoxysilane, 3-methacryloxypropylmethyldiethoxysilane, and 3-methacryloxypropyltriethoxysilane; monomers having an acrylic group such as 3-acryloxypropyltrimethoxysilane; monomers having an amino group such as N-2-(aminoethyl)-3-aminopropylmethyldimethoxysilane, N-2-(aminoethyl)-3-aminopropyltrimethoxysilane, 3-aminopropyltrimethoxysilane, 3-aminopropyltriethoxysilane, 3-triethoxysilyl-N-(1,3-dimethyl-butylidene)propylamine, and N-phenyl-3-aminopropyltrimethoxysilane; monomers having a ureido group such as 3-ureidopropyltriethoxysilane; monomers having a mercapto group such as 3-mercaptopropylmethyldimethoxysilane and 3-mercaptopropyltrimethoxysilane; monomers having a sulfide group such as bis(triethoxysilylpropyl)tetrasulfide; monomers having an isocyanate group such as 3-isocyanatepropyltriethoxysilane; polymers prepared through polymerization of a small amount of these monomers; and composite materials comprising a part of the materials listed above to which a functional group or a polymer is introduced may also be used. Moreover, part or all of the alkyl group or the phenyl group of these compounds may be substituted by fluorine. Furthermore, examples thereof include, but are not limited to, metal acetylacetonate, metal carboxylate, oxychlorides, chlorides, and mixtures thereof. Examples of metals include, but are not limited to, Ti, Sn, Al, Zn, Zr, In, in addition to Si, and mixtures thereof. Appropriate mixtures of precursors of the above-described metal oxides can also be used. Furthermore, a silane coupling agent having a hydrolyzable group having affinity and reactivity with silica and a water-repellant organic functional group in the molecule can be used as a silica precursor. Examples thereof include silane monomers such as n-octyltriethoxysilane, methyltriethoxysilane, and methyltrimethoxysilane; vinyl silanes such as vinyltriethoxysilane, vinyltrimethoxysilane, vinyltris(2-methoxyethoxy)silane, and vinylmethyldimethoxysilane; methacrylic silanes such as 3-methacryloxypropyltriethoxysilane and 3-methacryloxypropyltrimethoxysilane; expoxysilanes such as 2-(3,4-epoxycyclohexyl)ethyltrimethoxysilane, 3-glycidoxypropyltrimethoxysilane, and 3-glycidoxypropyltriethoxysilane; mercaptosilanes such as 3-mercaptopropyltrimethoxysilane and 3-mercaptopropyltriethoxysilane; sulfur silanes such as 3-octanoylthio-1-propyltriethoxysilane; aminosilanes such as 3-aminopropyltriethoxysilane, 3-aminopropyltrimethoxysilane, N-(2-aminoethyl)-3-aminopropyltrimethoxysilane, N-(2-aminoethyl)-3-aminopropylmethyldimethoxysilane, and 3-(N-phenyl)aminopropyltrimethoxysilane; and polymers prepared through polymerization of these monomers. Moreover, mesoporous materials may be prepared through addition of a surfactant to these materials.

In the cases where a mixture of TEOS and MTES is used as a solution of a sol gel material, the mixing ratio can be, for example, 1:1 in terms of a molar ratio. In the cases where the sol gel material is used, hydrolysis and polycondensation reactions are performed to generate amorphous silica. In the synthetic conditions, an acid such as hydrochloric acid or an alkali such as ammonia is added to adjust the pH of the solution. Moreover, a material generating an acid or an alkali through irradiation with light such as ultraviolet light may be added. The pH may be 4 or less or 10 or more. Moreover, water may be added to perform hydrolysis. The amount of water to be added can be 1.5 times or more the metal alkoxide in terms of the molar ratio.

Examples of the solvent for the sol gel material solution include alcohols such as methanol, ethanol, isopropyl alcohol (IPA), and butanol; aliphatic hydrocarbons such as hexane, heptane, octane, decane, and cyclohexane; aromatic hydrocarbons such as benzene, toluene, xylene, and mesitylene; ethers such as diethyl ether, tetrahydrofuran, and dioxane; ketones such as acetone, methyl ethyl ketone, isophorone, and cyclohexanone; ether alcohols such as butoxyethyl ether, hexyloxyethyl alcohol, methoxy-2-propanol, and benzyloxy ethanol; glycols such as ethylene glycol and propylene glycol; glycol ethers such as ethylene glycol dimethyl ether, diethylene glycol dimethyl ether, and propylene glycol monomethyl ether acetate; esters such as ethyl acetate, ethyl lactate, and γ-butyrolactone; phenols such as phenol and chlorophenol; amides such as N,N-dimethylformamide, N,N-dimethylacetamide, and N-methylpyrrolidone; halogen-based solvents such as chloroform, methylene chloride, tetrachloroethane, monochlorobenzene, and dichlorobenzene; hetero element-containing compounds such as carbon disulfide; water; and mixed solvents thereof. Moreover, ethanol and isopropyl alcohol may be used, or ethanol and isopropyl alcohol may be mixed with water for use.

As additives for the sol gel material solution, polyethylene glycol, polyethylene oxide, hydroxypropyl cellulose, and polyvinyl alcohol for adjusting viscosity, and solution stabilizers of alkanolamines such as triethanolamine, β-diketone such as acetylacetone, β-ketoester, formamide, dimethylformamide, and dioxane can be used.

Polysilazane may be used as a material for the projection-depression structure layer 3, "Polysilazane" indicates a polymer having a silicon-nitrogen bond, and is a ceramic precursor inorganic polymer composed of Si—N, Si—H, N—H, and the like, for $SiO_2$ and $Si_3N_4$ and a solid solution $SiO_xN_y$ intermediate between $SiO_2$ and $Si_3N_4$, and the like. For example, a compound having a main skeleton composed of a unit represented by the following formula (1) described in Japanese Unexamined Patent Publication No. H8-112879, and formed into ceramic at a relatively low temperature to be converted into silica may be used.

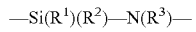

$$-Si(R^1)(R^2)-N(R^3)- \quad \text{formula (1):}$$

In the above formula (1), $R^1$, $R^2$, and $R^3$ each represent a hydrogen atom, an alkyl group, an alkenyl group, a cycloalkyl group, an aryl group, an alkylsilyl group, an alkylamino group, or an alkoxy group.

As the material for the projection-depression structure layer 3, perhydropolysilazane (also referred to as PUPS) or organopolysilazane can be used, and for example, silicon alkoxide-added polysilazane obtained through a reaction of polysilazane with silicon alkoxide (for example, Japanese Unexamined Patent Publication No. H5-238827), glycidol-added polysilazane obtained through a reaction thereof with glycidol (for example, Japanese Unexamined Patent Publication No. H6-122852), alcohol-added polysilazane obtained through a reaction thereof with alcohol (for example, Japanese Unexamined Patent Publication No. H6-240208), metal carboxylate-added polysilazane obtained through a reaction thereof with metal carboxylate (for example, Japanese Unexamined Patent Publication No. H6-299118), acetylacetonate complex-added polysilazane obtained through a reaction thereof with an acetylacetonate complex containing a metal (for example, Japanese Unexamined Patent Publication No. H6-306329), and metal nanoparticle-added polysilazane obtained through addition of metal nanoparticles (for example, Japanese Unexamined Patent Publication No. H7-196986) can also be used. As an organic solvent for preparing a liquid containing polysilazane, hydrocarbon solvents such as aliphatic hydrocarbons, alicyclic hydrocarbons, and aromatic hydrocarbons, halogenated hydrocarbon solvents, and ethers such as aliphatic ethers and alicyclic ethers can be used. The organic polysilazane may be a derivative in which hydrogen sites bonding to Si are partially substituted with an alkyl group or the like. An amine or a metal catalyst may also be added to promote conversion into a silicon oxide compound.

Moreover, a resin can also be used in the projection-depression structure layer 3. Examples of curable resins include photocurable, heat curable, moisture curable, and chemically curable (mixture of two solutions) resins. Specifically, examples thereof include a variety of resins such as epoxy, acrylic, methacrylic, vinyl ether, oxetane, urethane, melamine, urea, polyester, polyolefin, phenol, crosslinked liquid crystal, fluorine, silicone, and polyimide monomers, oligomers, and polymers.

Moreover, the surface of the projection-depression structure layer 3 may be subjected to hydrophobization. A known method can be used as a method of hydrophobization. For example, if the surface of the projection-depression structure layer 3 is a surface composed of silica, the surface may be hydrophobized with dimethyldichlorosilane, trimethylalkoxysilane, or the like, or may be hydrophobized with a trimethylsilylating agent such as hexamethyldisilazane and silicone oil; or a surface treatment method for metal oxide powder using supercritical carbon dioxide may be used. Giving hydrophobicity to the surface of the projection-depression structure layer 3 can readily remove moisture from the optical substrate 1 during the process of manufacturing the device to prevent generation of defects such as dark spots in the organic EL element or deterioration of the device in the cases where the optical substrate 1 is used in manufacturing of devices such as organic EL elements. Moreover, a gas barrier layer may be disposed on the surface of the projection-depression structure layer 3 to prevent invasion of moisture or a gas such as oxygen.

The material for the projection-depression structure layer 3 may be an inorganic material or a curable resin material containing an ultraviolet light absorbing material. The ultraviolet light absorbing material absorbs ultraviolet light and converts light energy into a harmless form such as heat, thereby demonstrating an action to suppress deterioration of films. Conventionally known materials can be used as the ultraviolet light absorbing material; for example, benzotriazole-based absorbers, triazine-based absorbers, salicylic acid derivative absorbers, and benzophenone-based absorbers can be used.

The projection-depression structure layer 3 is formed by applying the solution or the resin of the sol gel material prepared as above onto the support substrate 2, and transferring a projection-depression pattern of the mold for transferring a projection-depression pattern. The mold for transferring a projection-depression pattern and a manufacturing step of transferring a projection-depression pattern onto the projection-depression structure layer 3 will be described later.

Next, the shapes of projections and depressions formed on the surface of the projection-depression structure layer 3 will be described. The shapes of projections and depressions can be analyzed with a scanning probe microscope (SPM) such as an atomic force microscope (AFM). In the present embodiment, using a scanning probe microscope (such as a product name "E-sweep" made by Hitachi High-Tech Science Corporation), the shapes of projections and depressions of the projection-depression structure layer 3 are analyzed on the following analysis conditions to obtain an analyzed image of projections and depressions and an analyzed image seen in planar view. In the present specification, the average of distribution of the depth between a projection and a depression, the standard deviation of the depth between projections and depressions, the average depth of the depths between projections and depressions, the average pitch of projections and depressions, the average of widths of projection portions, and the proportion of the straight line section and the curved line section, which are defined below, can be determined by the following measurement method irrespective of the material of the surface on which projections and depressions are formed.

<Analysis Conditions>
measurement method: intermittent contact method with a cantilever
material for the cantilever: silicon
width of the lever of the cantilever: 40 μm
diameter of the distal end of the chip of the cantilever: 10 nm The shapes of projections and depressions formed on the surface of the projection-depression structure layer 3 in the optical substrate 1 are measured with a scanning probe microscope (such as a product name "E-sweep" made by Hitachi High-Tech Science Corporation) to obtain an analyzed image of projections and depressions. During analysis of projections and depressions, any measurement region of a 3 μm square (length: 3 μm, width: 3 μm) or a 10 μm square (length: 10 μm, width: 10 μm) is measured on the conditions mentioned above to determine an analyzed image of projections and depressions. At this time, the data on each depth between a projection and a depression at measurement points equal to or more than 16384 points (128 points in length×128 points in width) within the measurement region is determined in a scale of nanometer. The number of the measurement points varies according to the type of the measurement apparatus used or the setting thereof. For example, in cases where the above-mentioned product name "E-sweep" made by Hitachi High-Tech Science Corporation is used as the measurement apparatus, 65536 points (256 points in length×256 points in width) can be measured (measured at a resolution of 256×256 pixels) within the measurement region of a 3 μm square or a 10 μm square. Here, flat processing including primary inclination correction may be performed on the analyzed image of projections and depressions to enhance the precision in measurement. Moreover, to ensure sufficient precision in measurement in a variety of analyses related to the shapes of projections and depressions described below, the measurement region is preferably a square region having a length of one side 15 times or more the average of the widths of the projection portions included in the measurement region.

The measurement of the depth between a projection and a depression can be specifically performed as follows. First, among all of the measurement points, a measurement point P having the largest height from the surface of the support substrate 2 is determined. A plane containing the measurement point P and parallel to the surface of the support substrate 2 is determined as a reference plane (level plane); the value of the depth from the reference plane is calculated as the data on the depth between a projection and a depression. The value of the depth from the reference plane may be a difference obtained by subtracting the height of each measurement point from the support substrate 2 from the value of the height of the measurement point P from the support substrate 2, for example. Such data on the depth between a projection and a depression can be determined through automatic calculation with software or the like in a measurement apparatus in some measurement apparatuses (such as product name "E-sweep" made by Hitachi High-Tech Science Corporation).

After the data on the depth between a projection and a depression at each measurement point is determined as above, the calculated values obtained by the arithmetic average and the standard deviation thereof are used as the average of distribution of the depth between a projection and a depression and the standard deviation of the depth between a projection and a depression, respectively.

The average depth of the depths between projections and depressions indicates the average of differences in depth when a difference in depth between a projection portion and a depression portion on the surface of the projection-depression structure layer 3 on which projections and depressions are formed (distance in the depth direction between the vertex portion of a projection portion and the bottom portion of its adjacent depression portion) is measured. Such an average depth of the depths between projections and depressions can be calculated by measuring 100 or more distances in the depth direction between the vertex portions of any projection portions and the bottom portions of the adjacent depression portions in the analyzed image of projections and depressions, and determining the arithmetic average.

The average pitch of projections and depressions indicates the average of pitches of projections and depressions when pitches of projections and depressions on the surface of the projection-depression structure layer 3 on which projections and depressions are formed (interval between vertex portions of adjacent projection portions or between bottom portions of adjacent depression portions) are measured. Such an average pitch of projections and depressions can be calculated by measuring 100 or more intervals between vertex portions of any adjacent projection portions or between bottom portions of adjacent depression portions in the analyzed image of projections and depressions, and determining the arithmetic average.

The average pitch of projections and depressions can be within the range of 100 to 1500 nm, for example, and may further be within the range of 200 to 1200 nm. The average of distribution of the depth between a projection and a depression may be within the range of 20 to 200 nm, and may further be within the range of 30 to 150 nm. The standard deviation of the depth between a projection and a depression may be within the range of 10 to 100 nm.

In the present embodiment, a region in which the depth between a projection and a depression is equal to or more than the average of distribution of the depth between a projection and a depression is defined as a projection portion, while a region in which the depth between a projection and a depression is less than the average of distribution of the depth between a projection and a depression is defined as a depression portion. For example, the analyzed image of projections and depressions is processed such that the projection portions are indicated by white, and the depression portions are indicated by black; thereby, an analyzed image seen in planar view (monochromatic image) as shown in FIG. 2 is obtained. FIG. 2 is a diagram illustrating an example of an analyzed image seen in planar view of the measurement region in the optical substrate 1 according to the present embodiment.

Moreover, the width of the projection portion indicates the width of projection portion (unit indicated by white) in the analyzed image seen in planar view. An average of such widths of the projection portions can be calculated by selecting any 100 or more sites of the projection portions in the analyzed image seen in planar view, measuring the length from the boundary of the projection portions to the opposite boundary in each sites in the direction approximately orthogonal to the extending direction of the projection portion seen in planar view, and determining the arithmetic average.

When the average of the widths of the projection portions is calculated, the values at places extracted at random from the projection portion in the analyzed image seen in planar view as described above are used while the values at branched places of the projection portions may not be used. Whether or not a region of a projection portion is a region related to branching may be determined, for example, by whether or not the region extends at a predetermined extent or more. More specifically, it may be determined by whether or not the ratio of the extending length of the region to the width of the region is a predetermined value (for example, 1.5) or more.

Using FIG. 3, an example of a method of determining whether or not a region is branched will be described, the region being projected in a direction approximately orthogonal to the extended axis line of a projection portion extending in a direction at an intermediate position of the projection portion. Here, the extended axis line of the projection portion indicates a virtual axis line along the extending direction of a projection portion defined from the shape of the outer edge of the projection portion where the target region for determination about branching is excluded from the projection portion. More specifically, the extended axis line of the projection portion indicates a line drawn through an approximately midpoint of the width of the projection portion orthogonal to the extending direction of the projection portion. (a) of FIG. 3 and (b) of FIG. 3 are both schematic diagrams for illustrating an analyzed image seen in planar view in which a projection portion is partially cut out, and the region S indicates a projection portion. In (a) of FIG. 3 and (b) of FIG. 3, regions A1 and A2 projected on intermediate positions of projection portions are determined as targets region for determination about branching. In this case, when the regions A1 and A2 are excluded from the projection portions, extended axis lines L1 and L2 are each defined as a line drawn through an approximately midpoint of the width of the projection portion orthogonal to the extending direction of the projection portion. Such an extended axis line may be defined by image processing with a computer, may be defined by an operator who performs analysis, or may be defined by both image processing with a computer and manual operation by an operator. In (a) of FIG. 3, the region A1 is projected in the direction orthogonal to the extended axis line L1 at an intermediate position of the projection portion extending along the extended axis line L1. In (b) of FIG. 3, the region A2 is projected in the direction orthogonal to the extended axis line L2 at an intermediate position of the projection portion extending along the extended axis line L2. Based on the same way of thinking as the way of thinking described below about the regions A1 and A2, the regions projected oblique to the directions orthogonal to the extended axis lines L1 and L2 can also be determined whether or not the regions are branched.

According to the determination method, because the ratio of the extended length d2 of the region A1 to the width d1 of the region A1 is approximately 0.5 (less than 1.5), it is determined that the region A1 is not a region related to branching. In this case, the length d3 passing through the region A1 in the direction orthogonal to the extended axis line L1 is defined as one of the measurement values for calculating the average of the widths of the projection portions. In contrast, because the ratio of the extended length d5 of the region A2 to the width d4 of the region A2 is approximately 2 (1.5 or more), it is determined that the region A2 is a region related to branching. In this case, the length d6 passing through the region A2 in the direction orthogonal to the extended axis line L2 is not defined as one of the measurement values for calculating the average of the widths of the projection portions.

As illustrated in FIG. 2, in the optical substrate 1 according to the present embodiment, the extending directions of the projection portions (white portions) included in the shapes of projections and depressions formed on the surface of the projection-depression structure layer 3 are irregularly distributed seen in planar view. Namely, the projection portions have shapes extending in irregular directions rather than regularly aligned stripes or regularly arranged dots. Moreover, in the measurement region, namely in a predetermined region of the projection-depression structure layer 3, the outlines of the projection portions included in a region per unit area seen in planar view include more straight line sections than curved line sections.

Figure 4:
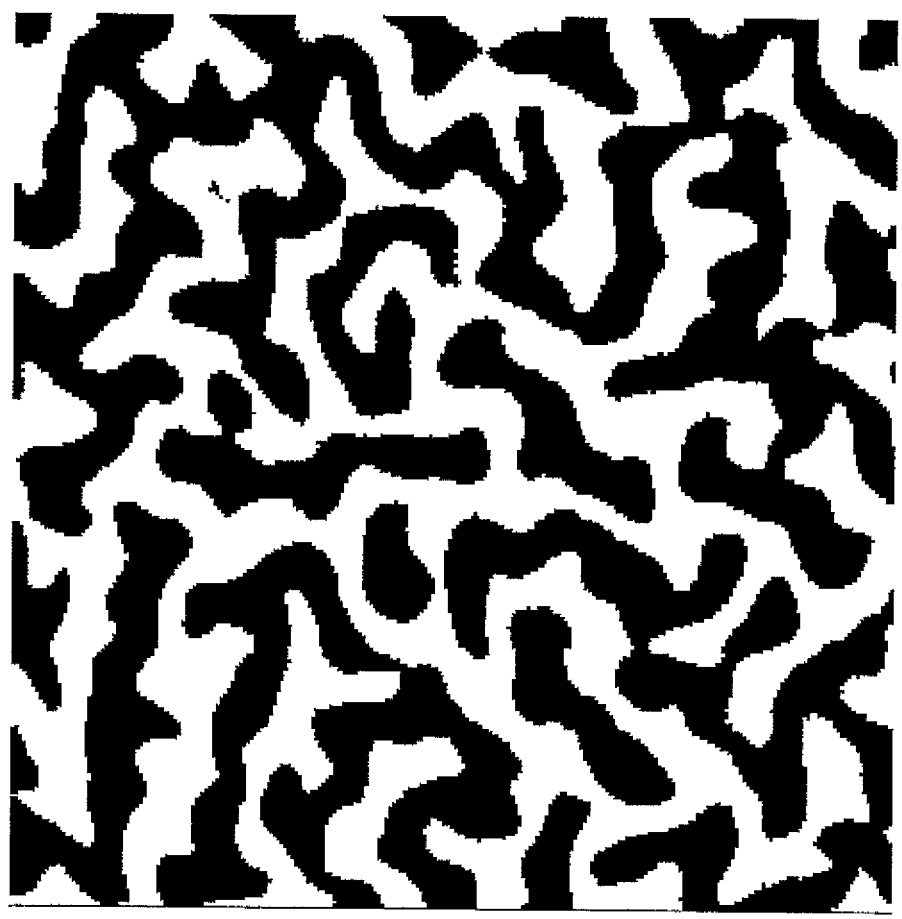
FIG. 4 is a diagram illustrating an example of an analyzed image seen in planar view of a measured region of the optical substrate according to Comparative Example.

FIG. 4 is a diagram illustrating an example of an analyzed image seen in planar view of a measurement region in the optical substrate according to Comparative Example. In the present embodiment, the term "include more straight line sections than curved line sections" indicates that the projection-depression pattern intuitively does not seem like a pattern of the optical substrate according to Comparative Example illustrated in FIG. 4 in which among all of the sections on the outline of a projection portion, curved line sections mostly constitute the outline of the projection portion. Whether or not the outline of the projection portion seen in planar view contains more straight line sections than curved line sections can be determined by using one of two methods of defining a curved line section described below, for example.

(First Method of Defining Curved Line Section)

In the first method of defining a curved line section, the curved line section is defined as a section in which a ratio of a linear distance between both ends of the section to the length of the outline between both ends of the section is 0.75 or less where a plurality of sections is formed by dividing the outline of the projection portion seen in planar view by the length of the average of the widths of the projection portion multiplied by a factor of $\pi$ (circular constant). Moreover, the straight line section is defined as a section other than the curved line section among the plurality of sections, namely, a section having the ratio of more than 0.75. Hereinafter, an example of a procedure to determine using the first definition method whether or not the outline of a projection portion seen in planar view contains more straight line sections than curved line sections will be described with reference to (a) of FIG. 5. (a) of FIG. 5 is a diagram illustrating part of an analyzed image seen in planar view of the projection-depression structure layer 3, in which depression portions are represented as white solid portions for convenience. The region Si represents a projection portion while a region S2 represents a depression portion.

Procedure 1-1. One projection portion is selected from a plurality of projection portions in the measurement region. Any position on the outline X of the projection portion is determined as a start point. In (a) of FIG. 5, Point A is set as a start point as one example. A reference point is disposed on the outline X of the projection portion at a predetermined interval from the start point. Here, the predetermined interval is a length of the average of the widths of the projection portion multiplied by a factor of ($\pi$ (circular constant)/2). In (a) of FIG. 5, Point B, Point C, and Point D are sequentially set as one example.

Procedure 1-2. When Points A to D as reference points are set on the outline X of the projection portion, the target section for determination is set. Here, the start point and the end point are reference points, and sections including the remaining reference points as intermediate points are set as the targets for determination. In the example in (a) of FIG. 5, if Point A is selected as the start point of a section, Point C set the second from Point A is the end point of the section. Here, the interval from Point A is set as the length of the average of the widths of the projection portion multiplied by a factor of ($\pi$/2), and therefore, Point C is a point located away from Point A along the outline X by the length of the average of the widths of the projection portion multiplied by a factor of $\pi$. Similarly, if Point B is selected as the start point of a section, Point D set the second from Point B is the end point of the section. Here, the target section is set in order of the setting, and assume that Point A is the first set point. Namely, first, the section between Point A and Point C (section AC) is determined as the target section for processing. The length La of the outline X of the projection portion connecting Point A and Point C and the linear distance Lb between Point A and Point C illustrated in (a) of FIG. 5 are then measured.

Procedure 1-3. Using the length La and the linear distance Lb measured in Procedure 1-2, the ratio of the linear distance Lb to the length La (Lb/La) is calculated. If the ratio is 0.75 or less, it is determined that Point B located as the midpoint of the section AC of the outline X of the projection portion is a point present in a curved line section. In contrast, if the ratio is more than 0.75, it is determined that Point B is a point present in a straight line section. In the example illustrated in (a) of FIG. 5, the ratio (Lb/La) is 0.75 or less; accordingly, it is determined that Point B is a point present in a curved line section.

Procedure 1-4. Procedure 1-2 and Procedure 1-3 are performed in cases where the respective points set in Procedure 1-1 are selected as start points.

Procedure 1-5. Procedure 1-1 to Procedure 1-4 are performed on all of the projection portions in the measurement region.

Procedure 1-6. In cases where among all of the points set for all of the projection portions in the measurement region, the proportion of the points determined as points present in straight line sections is 50% or more of all the points, it is determined that the outline of the projection portion seen in planar view includes more straight line sections than curved line sections. In contrast, in cases where among all of the points set for all of the projection portions in the measurement region, the proportion of the points determined as points present in straight line sections is less than 50% of all the points, it is determined that the outline of the projection portion seen in planar view includes more curved line sections than straight line sections.

The processings of Procedure 1-1 to Procedure 1-6 may be performed using a measurement function included in a measurement apparatus, by performing software for analysis or the like different from that included in the measurement apparatus, or manually.

The processing of setting points on the outline of the projection portion in Procedure 1-1 may be terminated when any more point cannot be set after the setting is done around the projection portion or when the setting is out of the measurement region. Moreover, because the ratio (Lb/La) cannot be calculated for sections external to the first set point and the last set point, these sections are treated as non-targets for determination. Moreover, projection portions having lengths of the outlines less than the average of the widths of projection portion multiplied by a factor of π are treated as non-targets for determination.

(Second Method of Defining Curved Line Section)

In the second method of defining a curved line section, the curved line section is defined as a section in which among two angles formed by the line segment (line segment AB) connecting one end of a segment (Point A) and the midpoint of the section (Point B) and the line segment (line segment CB) connecting the other end of the section (Point C) and the midpoint of the section (Point B), the smaller angle (180° or less) is an angle of 120° or less, where a plurality of sections is formed by dividing the outline of a projection portion seen in planar view by the length of the average of the widths of the projection portion multiplied by a factor of π (circular constant). Moreover, the straight line section is defined as a section other than the curved line section among the plurality of sections, namely, a section in which the smaller angle is more than 120°. Hereinafter, an example of a procedure to determine using the second definition method whether or not the outline of a projection portion seen in planar view contains more straight line sections than curved line sections will be described with reference to (b) of FIG. 5. (b) of FIG. 5 is a diagram illustrating part of an analyzed image seen in planar view of the same projection-depression structure layer 3 as that in (a) of FIG. 5.

Procedure 2-1. One projection portion is selected from a plurality of projection portions in the measurement region. Any position on the outline X of the projection portion is determined as a start point. In (b) of FIG. 5, Point A is set as a start point as one example. A reference point is disposed on the outline X of the projection portion at a predetermined interval from the start point. Here, the predetermined interval is a length of the average of the widths of the projection portion multiplied by a factor of (π (circular constant)/2). In (b) of FIG. 5, Point B, Point C, and Point D are sequentially set as one example.

Procedure 2-2. When Points A to D as reference points are set on the outline X of the projection portion, the target section for determination is set. Here, the start point and the end point are reference points, and sections including the remaining reference points as intermediate points are set as the targets for determination. In the example in (b) of FIG. 5, if Point A is selected as the start point of a section, Point C set the second from Point A is the end point of the section. Here, the interval from Point A is set as the length of the average of the widths of the projection portion multiplied by a factor of (π/2), and therefore, Point C is a point located away from Point A along the outline X by the length of the average of the widths of the projection portion multiplied by a factor of π. Similarly, if Point B is selected as the start point of a section, Point D set the second from Point B is the end point of the section. Here, the target section is set in order of the setting, and assume that Point A is the first set point. Namely, first, the section between Point A and Point C is determined as the target section for processing. Among the two angles formed by the line segment AB and the line segment CB, the smaller angle (180° or less) θ is then measured.

Procedure 2-3. If the angle θ is 120° or less, it is determined that Point B is a point present in a curved line section. In contrast, if the angle θ is more than 120°, it is determined that Point B is a point present in a straight line section. In the example illustrated in (b) of FIG. 5, because the angle θ is 120° or less, it is determined that Point B is a point present in a curved line section.

Procedure 2-4. Procedure 2-2 and Procedure 2-3 are performed in cases where the respective points set in Procedure 2-1 are selected as start points.

Procedure 2-5. Procedure 2-1 to Procedure 2-4 are performed on all of the projection portions in the measurement region.

Procedure 2-6. In cases where among all of the points set for all of the projection portions in the measurement region, the proportion of the points determined as points present in straight line sections is 70% or more of all the points, it is determined that the outline of the projection portion seen in planar view includes more straight line sections than curved line sections. In contrast, in cases where among all of the points set for all of the projection portions in the measurement region, the proportion of the points determined as points present in straight line sections is less than 70% of all the points, it is determined that the outline of the projection portion seen in planar view includes more curved line sections than straight line sections.

The processings of Procedures 2-1 to 2-6 may be performed using a measurement function included in a measurement apparatus, by performing software for analysis or the like different from that included in the measurement apparatus, or manually.

The processing of setting points on the outline of the projection portion in Procedure 2-1 may be terminated when any more point cannot be set after the setting is done around the projection portion or when the setting is out of the measurement region. Moreover, because the angle θ cannot be calculated for sections external to the first set point and the last set point, these sections are treated as non-targets for determination. Moreover, projection portions having lengths of the outlines less than the average of the widths of projection portion multiplied by a factor of π are treated as non-targets for determination.

As described above, it can be determined using one of the first and second methods of defining a curved line section whether or not the outline X of a projection portion seen in planar view in a measurement region includes more straight line sections than curved line sections. In the projection-depression structure layer 3 of the optical substrate 1, determination of "whether or not the outline of a projection portion seen in planar view included in a region per unit area includes more straight line sections than curved line sections" may be performed based on one measurement region extracted at random from regions on the surface of the projection-depression structure layer 3 of the optical substrate 1 and measured, or may be performed based on comprehensive determination of the results in determination of a plurality of different measurement regions in the same optical substrate 1. In this case, for example, among the results in determination of a plurality of different measurement regions, the results having larger number thereof may be used as the result of determination of "whether or not the outline of a projection portion seen in planar view included in a region per unit area includes more straight line sections than curved line sections". Generation of leak current can be reduced, and light emission efficiency can be enhanced by forming shapes of projections and depressions on the surface of the projection-depression structure layer 3 such that the above-mentioned conditions on the shape are satisfied.

In the optical substrate 1, the widths of the projection portion in the direction approximately orthogonal to the extending direction of the projection portion of the projection-depression structure layer 3 seen in planar view are constant. Whether or not the widths of the projection portion are constant or not can be determined based on the widths at 100 or more points of the projection portion obtained by the above-mentioned measurement. Specifically, from the widths at 100 or more points of the projection portion, the average of the widths of the projection portion and the standard deviation of the widths of the projection portion are calculated. The value calculated by dividing the standard deviation of the widths of the projection portion by the average of the widths of the projection portion (standard deviation of the width of the projection portion/average of the widths of the projection portion) is then defined as the coefficient of variation of the width of the projection portion. This coefficient of variation has a smaller value as the widths of the projection portion are more constant (a fluctuation in width is smaller). Accordingly, whether or not the widths of the projection portion are constant can be determined according to whether or not the coefficient of variation is a predetermined value or less. For example, it can be defined that the widths of the projection portion are constant if the coefficient of variation is 0.25 or less. Generation of leak current can be reduced, and light emission efficiency can be enhanced by forming shapes of projections and depressions on the surface of the projection-depression structure layer 3 such that the above-mentioned conditions on the shape are satisfied.

In the following description, a condition indicating that the proportion of the straight line section determined by the first definition method is 50% or more (or proportion of the straight line section determined by the second definition method is 70% or more) is referred to as "straight line condition", and a condition indicating that the coefficient of variation of the width of the projection portion is 0.25 or less is referred to as "width condition".

In cases where in the optical substrate 1, an analyzed image of projections and depressions obtained through analysis, with a scanning probe microscope, of the shapes of projections and depressions formed on the surface of the projection-depression structure layer 3 is subjected to two-dimensional high-speed Fourier transformation to obtain a Fourier transformed image, the Fourier transformed image shows a circular pattern or an annular pattern in which the origin having the absolute value of a wavenumber of 0 $\mu m^{-1}$ is approximately in the center, and the circular pattern or the annular pattern may be present within the region having an absolute value of a wavenumber within the range of 10 $\mu m^{-1}$ or less (may be within the range of 0.667 to 10 $\mu m^{-1}$, or may further be within the range of 0.833 to 5 $\mu m^{-1}$). If shapes of projections and depressions are formed on the surface of the projection-depression structure layer 3 such that the above conditions (hereinafter, referred to as "FFT condition") are satisfied, the wavelength dependency of light emission and the orientation (properties of light intensely emitting in a predetermined direction) can be sufficiently reduced.

The term "a circular pattern or an annular pattern of a Fourier transformed image" indicates a pattern observed as a result of gathering of bright points in the Fourier transformed image. For this reason, the term "circular" here indicates that the pattern composed of gathering bright points looks approximately circular, and the concept includes a pattern whose outer shape partially looks like projections or depressions. Moreover, the term "annular" indicates that the pattern composed of gathering bright points looks approximately annular, is the concept including a pattern of an annular shape whose outer circle and/or inner circle looks approximately circular, and partially looks projected or depressed. Moreover, the term "the circular pattern or the annular pattern is present within the region having an absolute value of a wavenumber within the range of 10 $\mu m^{-1}$ or less (may be within the range of 0.667 to 10 $\mu m^{-1}$, or may further be within the range of 0.833 to 5 $\mu m^{-1}$)" indicates that among the bright points forming a Fourier transformed image, 30% or more of the bright points is present within a region having an absolute value of a wavenumber within the range of 10 $\mu m^{-1}$ or less (may be within the range of 0.667 to 10 $\mu m^{-1}$, or may further be within the range of 0.833 to 5 $\mu m^{-1}$).

The followings are found about the relation between the pattern of the projection-depression structure and a Fourier transformed image. If the projection-depression structure itself does not have any distribution of the pitch or any orientation thereof, the Fourier transformed image also appears as a random pattern (no pattern); if the projection-depression structure, as a whole, is isotropic in the X and Y directions but has distribution of the pitch, a circular or annular Fourier transformed image appears. Moreover, if the projection-depression structure has a single pitch, the annular shape appearing in the Fourier transformed image tends to be sharp.

The Fourier transformed image is obtained as follows: the shapes of projections and depressions formed on the surface of the projection-depression structure layer 3 are analyzed with a scanning probe microscope (such as a product name "E-sweep" made by Hitachi High-Tech Science Corporation) to obtain an analyzed image of projections and depressions, and then, the analyzed image of projections and depressions is subjected to two-dimensional high-speed Fourier transformation. The two-dimensional high-speed Fourier transformation of the analyzed image of projections and depressions can be easily performed by electronic image processing using a computer including software for two-dimensional high-speed Fourier transformation.

[Method of Manufacturing Optical Substrate]

Next, a method of manufacturing the above-mentioned optical substrate 1 will be described. The optical substrate 1 can be manufactured as follows, for example. First, while a film-shaped mold 5 having a projection-depression pattern formed thereon is being pressed against an undercoat material layer 4 formed by applying a sol gel material, as a material for a projection-depression structure layer 3, on a support substrate 2, the undercoat material layer 4 is hardened. Subsequently, the film-shaped mold 5 is removed from the undercoat material layer 4 after hardening (projection-depression structure layer 3). Hereinafter, the film-shaped mold 5 and the above steps will be described in detail using FIG. 6.

Figure 6:
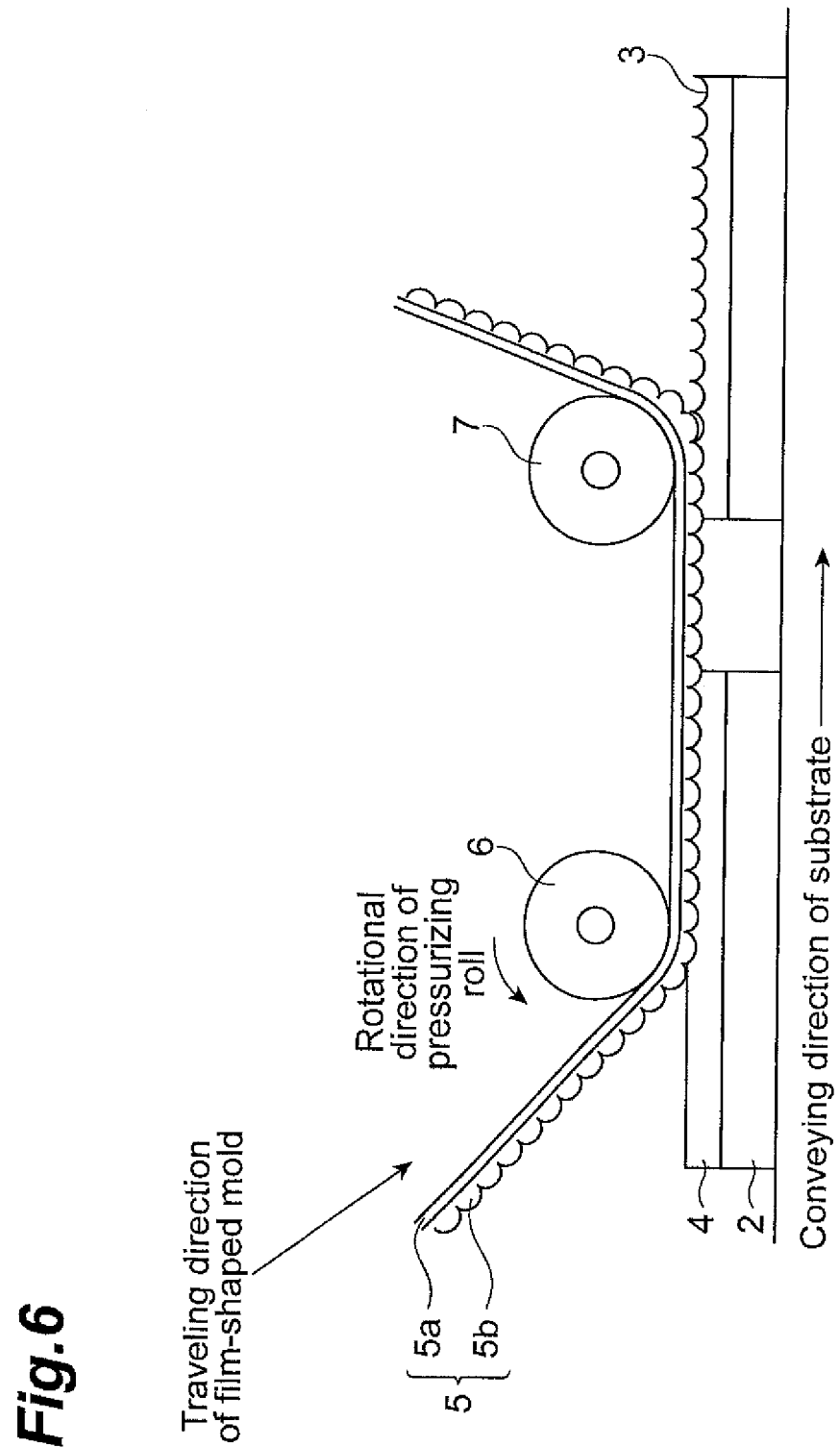
FIG. 6 is a diagram for illustrating a process of manufacturing an optical substrate.

As illustrated in FIG. 6, the film-shaped mold 5 includes a substrate portion 5a, and a projection-depression portion 5b formed on the substrate portion 5a. The substrate portion 5a and the projection-depression portion 5b both have flexibility. A projection-depression pattern is preliminarily formed on the surface of the projection-depression portion 5b through transfer of the projection-depression pattern from a metal mold 8 described later. The substrate portion 5a is in the form of a film or a sheet, and is formed of an organic material such as a silicone resin, polyethylene terephthalate (PET), polyethylene terenaphthalate (PEN), polycarbonate (PC), a cycloolefin polymer (COP), polymethyl methacrylate (PMMA), polystyrene (PS), polyimide (P1), or polyarylate, for example. Moreover, the projection-depression portion 5b may be formed of the same material as that for the substrate portion 5a to be formed integrally with the substrate portion 5a, or a different material may be used. As a material for forming the projection-depression portion 5b, a photocurable resin, a heat curable resin, a thermoplastic resin, or the like can be used. Moreover, the substrate portion 5a may be surface treated, or an easily-adhesive layer may be disposed on the substrate portion 5a to enhance adhesion; or a gas barrier layer may be disposed on the substrate portion 5a to prevent invasion of moisture or a gas such as oxygen.

The dimension of the film-shaped mold 5, particularly the length thereof can be appropriately set according to the dimension of the optical substrate 1 to be mass produced or the number of the optical substrate 1 continuously manufactured in a single manufacturing process (the number of lots). For example, a long mold having a length of 10 m or more may be used to continuously transfer a pattern to a plurality of substrates while a film-shaped mold 5 wound around a roll is being continuously fed from the roll. The width of the film-shaped mold 5 can be 50 to 3000 mm, and the thickness thereof can be 1 to 500 µm. A surface treatment or a treatment facilitating adhesion may be performed between the substrate portion 5a and the projection-depression portion 5b to enhance adhesion. Moreover, the surface of the projection-depression pattern of the projection-depression portion 5b may be subjected to a release treatment when necessary.

As illustrated in FIG. 6, the film-shaped mold 5 is fed between a pressurizing roll 6 and the support substrate 2 conveyed immediately under the film-shaped mold 5 to transfer the projection-depression pattern of the projection-depression portion 5b in the film-shaped mold 5 onto the undercoat material layer 4 on the support substrate 2. Here, after the film-shaped mold 5 is pressed against the undercoat material layer 4, the undercoat material layer 4 may be pre-calcinated. Gelation of the undercoat material layer 4 progresses through pre-calcination to solidify the projection-depression pattern, so that the projection-depression pattern is barely damaged during releasing. In cases where pre-calcination is performed, the undercoat material layer 4 may be heated at a temperature of 40 to 150° C. in the air. Pre-calcination does not always need to be performed.

After pressurizing of film-shaped mold 5 or pre-calcination of the undercoat material layer 4, the film-shaped mold 5 is released from the undercoat material layer 4. A known releasing method can be used in releasing of the film-shaped mold 5. For example, the film-shaped mold 5 may be released while being heated. Thereby, a gas generated from the undercoat material layer 4 can be escaped to prevent generation of air bubbles in the undercoat material layer 4. In cases where a roll process is used, a peel force may be smaller than that in a plate-shaped mold used in a press method, and the film-shaped mold 5 can be readily released from the undercoat material layer 4 without the undercoat material layer 4 remaining on the film-shaped mold 5. Particularly, because the undercoat material layer 4 is pressurized while being heated, the reaction readily progresses, and the film-shaped mold 5 is readily released from the undercoat material layer 4 immediately after pressurizing. Furthermore, a release roll 7 may be used to enhance the releasing properties of the film-shaped mold 5. In the present embodiment, as illustrated in FIG. 6, a release roll 7 is disposed downstream of the pressurizing roll 6 to rotatably support the film-shaped mold 5 while the film-shaped mold 5 is being urged against the undercoat material layer 4 with the release roll 7. Thereby, a state where the film-shaped mold 5 is applied to the undercoat material layer 4 can be maintained by the distance between the pressurizing roll 6 and the release roll 7 (for a predetermined period of time). The traveling direction of the film-shaped mold 5 is then changed downstream of the release roll 7 so as to draw the film-shaped mold 5 upward from the release roll 7. Thereby, the film-shaped mold 5 is peeled off from the undercoat material layer 4 in which projections and depressions are formed. The above-mentioned pre-calcination of the undercoat material layer 4 or heating may be performed during the period of time in which the film-shaped mold 5 is applied to the undercoat material layer 4. In cases where the release roll 7 is used, releasing of the film-shaped mold 5 can be further facilitated through releasing while heating to, for example, 40 to 150° C. is being performed.

After the film-shaped mold 5 is released from the undercoat material layer 4, the undercoat material layer 4 may be hardened. Thereby, a projection-depression structure layer 3 having a projection-depression pattern as illustrated in FIG. 1 is formed. In the present embodiment, the undercoat material layer 4 composed of the sol gel material can be hardened by main calcination. Hydroxyl groups and the like contained in silica (amorphous silica) forming the undercoat material layer 4 are removed by main calcination, thereby the strength of the undercoat material layer 4 is increased. Main calcination is preferably performed at a temperature of 200 to 1200° C. for about 5 minutes to 6 hours. The undercoat material layer 4 is thus hardened to form a projection-depression structure layer 3 having a projection-depression pattern corresponding to the projection-depression pattern of the film-shaped mold 5. At this time, if the projection-depression structure layer 3 is composed of silica, the projection-depression structure layer 3 becomes amorphous, crystalline, or a mixed state of amorphous and crystalline states according to the calcination temperature and the calcination time.

Moreover, a material generating an acid or an alkali through irradiation with light such as ultraviolet light may be added to the undercoat material layer 4. Moreover, when the projection-depression pattern of the projection-depression portion 5b of the film-shaped mold 5 is transferred onto the undercoat material layer 4 on the support substrate 2, the undercoat material layer 4 may be photocured through irradiation with energy beams such as UV or excimer UV to manufacture the optical substrate 1. Moreover, a gas barrier layer may be disposed on the surface of the projection-depression structure layer 3 to prevent invasion of moisture or a gas such as oxygen.

[Method of Manufacturing Film-Shaped Mold]

Next, the method of manufacturing the film-shaped mold 5 will be described. To produce a film-shaped mold 5, a master pattern for forming a projection-depression pattern on a mold is first produced. The master projection-depression pattern may be formed, for example, by a method using self-organization through heating of a block copolymer (microphase separation) (hereinafter, appropriately referred to as "BCP (Block Copolymer) heat annealing method") described in WO2012/096368 by the present applicants, or by a method using self-organization of a block copolymer under a solvent atmosphere (hereinafter, appropriately referred to as "BCP solvent annealing method") disclosed in WO2011/007878 A1 by the present applicants. The master projection-depression pattern may be formed by photolithography instead of the BCP heat annealing method and the BCP solvent annealing method. Besides, the master projection-depression pattern can also be produced, for example, by machining, microfabrication methods such as an electron beam direct drawing method, a corpuscular beam processing method, and an operation probe processing method, and microfabrication methods using self-organization of nanoparticles. If the pattern is formed by the BCP heat annealing method, any material can be used as a material for forming a pattern. For example, the material may be a block copolymer composed of a combination of two materials selected from the group consisting of styrene polymers such as polystyrene, polyalkyl methacrylate such as polymethyl methacrylate, polyethylene oxide, polybutadiene, polyisoprene, polyvinylpyridine, and polylactic acid.

The BCP solvent annealing method is a method of solvent annealing (solvent phase separation) a thin film of a block copolymer applied onto a substrate and dried under an atmosphere of a steam of an organic solvent and forming a phase separated structure of the block copolymer inside the thin film instead of performing the first heating step, the etching step, and the second heating step in the BCP heat annealing method described in WO2012/096368. Self-organization of the block copolymer progresses through this solvent annealing, so that the block copolymer can be subjected to microphase separation and a projection-depression structure can be formed.

Solvent annealing can be performed, for example, by generating an atmosphere of steam of an organic solvent inside the air-tight container like a desiccator, and exposing a thin film of a block copolymer as a target product to the atmosphere. The steam of the organic solvent may have a high concentration to promote phase separation of the block copolymer. Moreover, the steam of the organic solvent may have a saturated vapor pressure. In this case, control of the concentration is also relatively easy. For example, if the organic solvent is chloroform, it is known that the quantity of saturated steam is 0.4 g/l to 2.5 g/l at room temperature (0° C. to 45° C.). The treatment time by solvent annealing may be 6 hours to 168 hours, 12 hours to 48 hours, or 12 hours to 36 hours.

The organic solvent used in solvent annealing may be an organic solvent having a boiling point of 20° C. to 120° C. For example, chloroform, dichloromethane, toluene, tetrahydrofuran (THF), acetone, carbon disulfide, and mixed solvents thereof can be used. Among these solvents, chloroform, dichloromethane, acetone, and a mixed solvent of acetone/carbon disulfide may be used. The temperature of the atmosphere during solvent annealing may be within the range of 0° C. to 45° C. If the temperature of the atmosphere during solvent annealing is higher than 45° C., a projection-depression structure to be formed on a thin film is softened and readily damaged. The organic solvent barely evaporates in environments at a temperature lower than 0° C., so that phase separation of the block copolymer is barely caused.

The projection-depression structure of the thin film obtained by the solvent annealing described above may be subjected to a heat treatment. Because the projection-depression structure is already formed by solvent annealing, the projection-depression structure already formed is smoothed by this heat treatment, although the heat treatment is not always needed. The heat treatment may be effective if protrusions are generated on part of the surface of the projection-depression structure after solvent annealing for some reasons, or may be effective in adjusting the period or the height of the projection-depression structure. The heating temperature can be set at a temperature equal to or higher than the glass transition temperature of the polymer segment forming the block copolymer, for example, and can be set at a temperature equal to or higher than the glass transition temperature of the homopolymer thereof and equal to or lower than a temperature 70° C. higher than the glass transition temperature, for example. The heat treatment can be performed in the air atmosphere using an oven or the like. After solvent annealing is performed, etching may be performed by a dry etching such as an etching of irradiation with an energy beam which is an UV, excimer UV, or the like, or like RIE (reactive ion etching). Moreover, a heat treatment may be further performed.

A metal mold having a projection-depression pattern further transferred by electrocasting or the like can be formed after the master projection-depression pattern is formed by the BCP heat annealing method, the BCP solvent annealing method, or the like. First, a seed layer serving as a conductive layer for electrocasting can be formed on the master having the pattern by non-electrolytic plating, sputtering, deposition, and the like. The thickness of the seed layer may be 10 nm or more to provide a uniform current density in the subsequent electrocasting step and provide a constant thickness of a metal layer deposited in the subsequent electrocasting step. As a material for the seed layer, nickel, copper, gold, silver, platinum, titanium, cobalt, tin, zinc, chromium, gold-cobalt alloys, gold-nickel alloys, boron-nickel alloys, solder, copper-nickel-chromium alloys, tin nickel alloys, nickel-palladium alloys, nickel-cobalt-phosphorus alloys, and alloys thereof can be used, for example. Next, a metal layer is deposited on the seed layer through electrocasting (electrolytic plating). The total thickness of the metal layer including the thickness of the seed layer can be a thickness of 10 to 3000 μm, for example. As a material for the metal layer deposited through electrocasting, any of the metals listed above and used in the seed layer can be used. It is desired that the formed metal layer have appropriate hardness and thickness in view of facilitating the subsequent treatments such as pressing of the film-shaped mold 5 to the projection-depression portion 5b, releasing, and washing.

The metal layer including the seed layer thus obtained is released from the master having a projection-depression structure and a metal substrate is obtained. Releasing of the metal layer may be physically performed, or the materials for forming a pattern may be dissolved in an organic solvent which dissolves these, such as toluene, tetrahydrofuran (THF), or chloroform to be removed. When the metal substrate is released from the master, the remaining material components can be removed by washing. As a washing method, wet washing using a surfactant or the like or dry washing using ultraviolet light, plasma, or the like can be used. Moreover, the remaining material components may be removed through adhesion to a pressure-sensitive adhesive or an adhesive, for example. A metal substrate having a pattern transferred from the master is thereby obtained.

Figure 7:
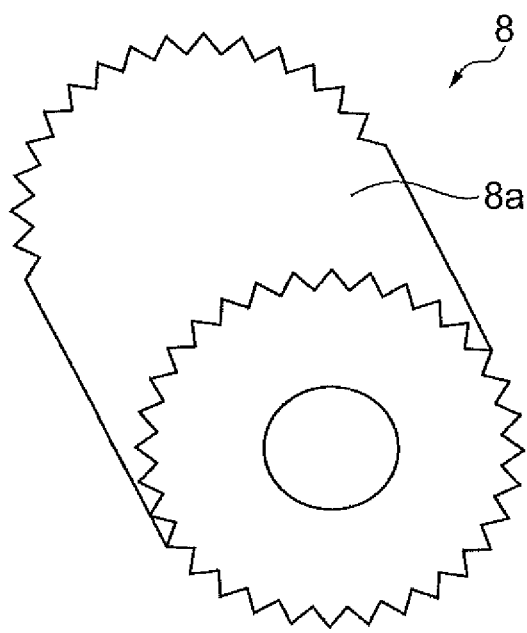
FIG. 7 is a schematic perspective view of a metal mold.

The metal substrate may be formed into a roll with the projection-depression pattern facing toward the outside. Thereby, as illustrated in FIG. 7, a cylindrical metal mold 8 having a projection-depression portion 8a formed along the outer periphery is obtained. Here, the projection-depression pattern formed in the projection-depression portion 8a is a projection-depression pattern formed through microphase separation of a block copolymer by a BCP heat annealing method, a BCP solvent annealing method, or the like as described above, and is a projection-depression pattern corresponding to the shapes of projections and depressions formed on the projection-depression structure layer 3 of the optical substrate 1. In FIG. 7, the detailed illustration of the projection-depression pattern formed on the projection-depression portion 8a is omitted.

Subsequently, a method of producing the film-shaped mold 5 by transferring the projection-depression pattern of the metal mold 8 will be described. After a curable resin is applied onto the substrate portion 5a and a resin layer (serving as a projection-depression portion 5b) is formed on the substrate portion 5a, the resin layer is hardened while the projection-depression portion 8a of the metal mold 8 is being pressed against the resin layer. Here, as the curable resin, a variety of resins such as epoxy, acrylic, methacrylic, vinyl ether, oxetane, urethane, melamine, urea, polyester, phenol, crosslinked liquid crystal, fluorine, and silicone resins can be used. As a method of applying a curable resin onto the substrate portion 5a, a variety of coating methods such as spin coating, spray coating, dip coating, dropping, gravure printing, screen printing, relief printing, die coating, curtain coating, inkjet process, and sputtering can be used, for example. Furthermore, although the conditions for hardening the curable resin vary according to the type of the resin to be used, the curing temperature may be within the range of room temperature to 250° C., and the curing time may be within the range of 0.5 minutes to 3 hours, for example. Moreover, a method of hardening the resin through irradiation with energy beams such as ultraviolet light or electron beams may be used; in this case, the irradiation intensity may be within the range of 20 $mJ/cm^2$ to 5 $J/cm^2$.

Next, the metal mold 8 is removed from the resin layer after hardening. The method of removing the metal mold 8 is not limited to a mechanical releasing method, and a known method can be used. A film-shaped mold 5 in which a projection-depression portion 5b having projections and depressions formed thereon is formed on the substrate portion 5a is thereby obtained. The film-shaped mold 5 can also be used as an optical substrate in the form of a film.

As illustrated in (b) of FIG. 1, a coating layer 9 may be formed on the projection-depression structure layer 3 in the optical substrate 1. Thereby, an optical substrate 20 is manufactured in which the coating layer 9 is formed in a film thickness within the range of 25 to 150% of the standard deviation of the depth between a projection and a depression in the projection-depression structure layer 3. According to the optical substrate 20, if foreign substances or defects are present on the surface of the projection-depression structure layer 3, these can be covered with the coating layer 9. In cases where the optical substrate 20 having the coating layer 9 formed thereon is used as a substrate for an organic EL element, the resulting organic EL element has good out-coupling efficiency, and the leak current thereof can be effectively suppressed. Accordingly, the optical substrate 20 having the coating layer 9 formed thereon is effective as a member used in a variety of devices such as organic EL elements.

As the material for the coating layer 9 (coating material), materials used for the projection-depression structure layer 3, the same sol gel materials as those used for the undercoat material layer 4, polysilazane, curable resins, and the like can be used.

As the coating material, inorganic materials such as $TiO_2$, ZnO, ZnS, ZrO, $BaTiO_3$, and $SrTiO_2$ may be used. Among these inorganic materials, $TiO_2$ may be used in relation to film forming properties and the refractive index. The coating layer 9 can be formed by any method; a method of applying a solution of a sol gel material for gelation, a method of applying an inorganic nanoparticle dispersion liquid and drying the liquid, liquid phase deposition (LPD: Liquid Phase Deposition), and the like can be used. If a dispersion liquid of $TiO_2$ is used, a sol-gel method of applying a sol gel solution using alkoxide of titanium or an organic compound thereof by spin coating or the like, and gelating the solution through drying with heating may be used.

Moreover, a silane coupling agent may be used as the coating material. If an organic EL element is manufactured using the optical substrate 20 having the projection-depression structure layer 3, the adhesion between the coating layer 9 and a layer to be formed thereon such as an electrode can be thereby enhanced, and resistance in the washing step and the treatment step at high temperature in the manufacturing process of the organic EL element can be improved. The type of the silane coupling agent used in the coating layer 9 is not particularly limited. As such a silane coupling agent, an organic compound represented by $RSiX_3$ can be used, for example. R is an organic functional group containing at least one group selected from the group consisting of a vinyl group, a glycidoxy group, an acrylic group, a methacrylic group, an amino group, and a mercapto group; X is a halogen element or an alkoxyl group. As the method of applying the silane coupling agent, a variety of coating methods such as spin coating, spray coating, dip coating, dropping, gravure printing, screen printing, relief printing, die coating, curtain coating, inkjet process, and sputtering can be used, for example. Subsequently, the coating can be dried on an appropriate condition according to the materials and a hardened film can be obtained. For example, the coating may be dried with heating at 100 to 150° C. for 15 to 90 minutes.

Moreover, the surface of the coating layer 9 may be subjected to hydrophobization. As the hydrophobization method, a known method may be used; for example, if the surface of the coating layer 9 is a surface composed of silica, the surface can be hydrophobized with dimethyldichlorosilane, trimethylalkoxysilane, or the like; a method of hydrophobizing the surface with a trimethylsilylating agent such as hexamethyldisilazane and silicone oil; a method of surface treating metal oxide powder using supercritical carbon dioxide may be used. Giving hydrophobicity to the surface of the coating layer 9 can readily remove moisture from the optical substrate 20 during the manufacturing process in cases where the optical substrate 20 is used in manufacturing of devices such as organic EL elements. Thereby, generation of defects such as dark spots in the organic EL element or deterioration of devices can be prevented.

The undercoat material and/or the coating material may be an inorganic material or a curable resin material containing an ultraviolet light absorbing material. The ultraviolet light absorbing material absorbs ultraviolet light and converts light energy into a harmless form such as heat, thereby demonstrating an action to suppress deterioration of films. Conventionally known materials can be used as the ultraviolet light absorbing material; for example, benzotriazole-based absorbers, triazine-based absorbers, salicylic acid derivative absorbers, and benzophenone-based absorbers can be used.

[Organic EL Element]

(a) of FIG. 8 is a sectional view schematically illustrating an example (organic EL element 100) of an organic EL element (light emitting element) using the optical substrate 1 as a diffraction grating substrate. (b) of FIG. 8 is a sectional view schematically illustrating an example (organic EL element 200) of an organic EL element (light emitting element) using an optical substrate 20 as a diffraction grating substrate.

As a method of laminating an organic layer 11, a known method such as deposition, sputtering, spin coating, or die coating can be appropriately used. As illustrated in (a) of FIG. 8, in the organic EL element 100, a support substrate 2, a projection-depression structure layer 3, a first electrode 10, an organic layer 11, and a second electrode 12 are laminated in this order such that the shapes of projections and depressions formed on the surface of the projection-depression structure layer 3 are maintained in these layers.

In contrast, as illustrated in (b) of FIG. 8, in cases where a coating layer 9 is formed on the projection-depression structure layer 3 by a conventionally known application method, a solution for forming the coating layer 9 is readily accumulated on the depression portions of the surface of the projection-depression structure layer 3, and therefore the resulting shape of the coating layer 9 is shapes of projections and depressions milder than the shapes of the projections and depressions of the projection-depression structure layer 3. The first electrode 10, the organic layer 11, and the second electrode 12 formed on the coating layer 9 are formed such that the shapes of projections and depressions formed on the surface of the coating layer 9 are maintained in these layers.

It should be noted that in both of these cases described above, the surface of the organic layer 11 may be formed to have a shape milder than the projection-depression pattern formed on the surface of the projection-depression structure layer 3 or the coating layer 9. Moreover, the surface may be flat. Similarly, the surface of the second electrode 12 laminated on the organic layer 11 may be formed to have a shape milder than the projection-depression pattern formed on the organic layer 11, or may be flat. For example, in cases where the organic layer 11 is formed by a conventionally known application method, the shape of the organic layer 11 is shapes of projections and depressions even milder than the shapes of projections and depressions of the first electrode 10.

The first electrode 10 has transmissive property to transmit light from the organic layer 11 formed thereon to the optical substrate 1. Accordingly, the first electrode 10 is also referred to as transparent electrode. As an electrode material, indium oxide, zinc oxide, tin oxide, composites thereof, i.e., indium-tin-oxide (ITO), gold, platinum, silver, and copper are used, for example. Among these materials, ITO may be used in view of transparency and conductivity. The organic layer 11 is not particularly limited as long as it can be used as an organic layer of an organic EL element, and a known organic layer can be appropriately used. As a material for the second electrode 12, a substance having a small work function can be appropriately used, and examples thereof include, but are not particularly limited to, aluminum, MgAg, MgIn, and AlLi.

Figure 9:
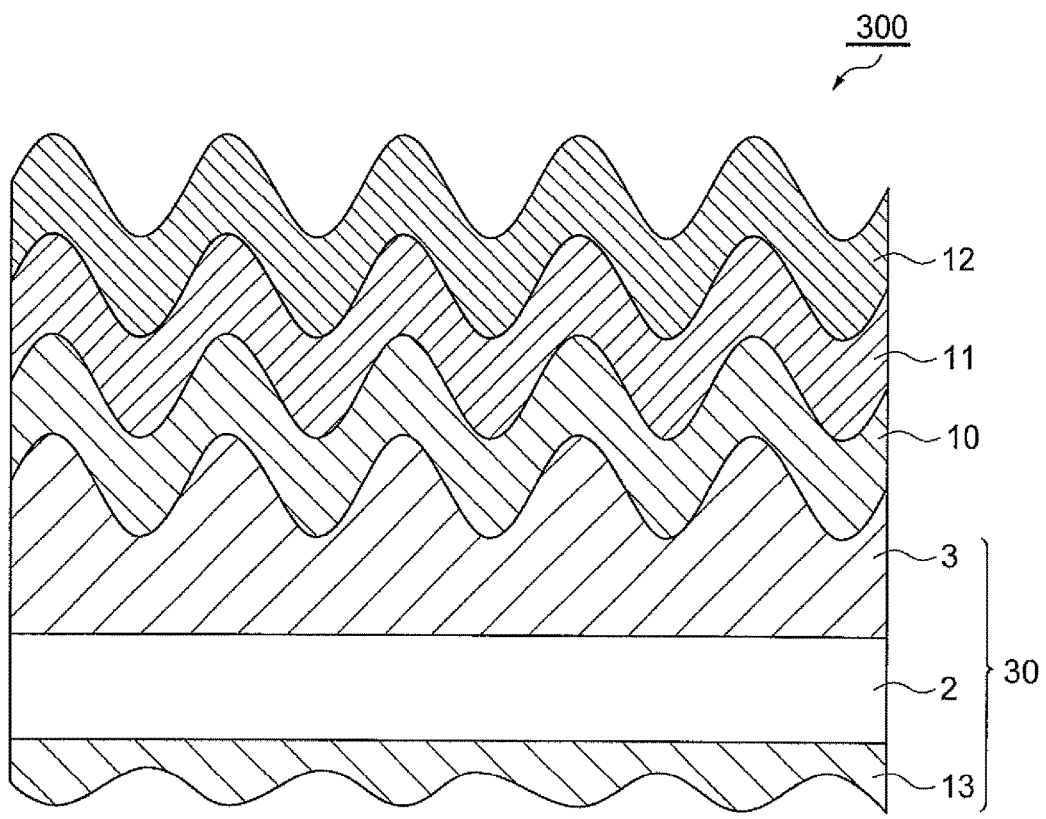
FIG. 9 is a sectional view schematically illustrating a modification of the organic EL element.

A modification (organic EL element 300) of the organic EL element 100 is illustrated in FIG. 9. The organic EL element 300 uses an optical substrate 30 having an optical functional layer 13 disposed on the outer surface (surface opposite to the surface on which the projection-depression structure layer 3 is formed) of the support substrate 2 as diffraction grating. Total reflection of the light passing through the support substrate 2 at the interface between the support substrate 2 (including the optical functional layer 13) and air can be suppressed through disposition of such an optical functional layer 13 and out-coupling efficiency can be enhanced. As the optical functional layer 13, a hemispherical lens or a corrugated structure lens (microlens described in Japanese Unexamined Patent Publication No. 2011-243308) can be used, for example. The optical functional layer 13 can be any optical functional layer which can be used for extraction of light from the organic EL element 300 and is not particularly limited; any optical member having a structure which can control refraction, convergence, diffusion (scattering), diffraction, reflection, and the like of light to extract light to the outside of the element can be used. As the optical functional layer 13, a variety of lens members such as a convex lens like a hemispherical lens, a concave lens, a prism lens, a cylindrical lens, a lenticular lens, and a microlens composed of a projection-depression layer having a corrugated structure which can be formed by the same method as the above-mentioned method of manufacturing the optical substrate 1 can be used, for example. Moreover, as the optical functional layer 13, a diffusion sheet or plate in which a diffusion material is kneaded into a transparent substance may be used; a diffusion sheet or plate having a projection-depression structure on the surface thereof, a diffraction grating, and a member having an anti-reflective function may be used. Among these members, a lens member may be used because the lens member can more efficiently extract light. Moreover, as these lens members, a plurality of lens members may be used; in this case, fine lens members may be aligned to form a so-called microlens (array). As the optical functional layer 13, commercially available products may be used.

Moreover, as such an optical functional layer 13 for extracting light to the outside, those having a variety of sizes and shapes can be used according to, for example, the applications of the organic EL element or the size and the configuration of the organic EL element; from the viewpoint of suppressing reflection at the interface between the air and the external extracting structure, a microlens composed of a projection-depression layer having a corrugated structure which can be formed by the same method as the method of manufacturing a hemispherical lens and a diffraction grating substrate described later may be used. Furthermore, in cases where the thickness of the organic EL element is not important (thickness thereof may be large), a hemispherical lens may be used as the optical functional layer 13. Moreover, in cases where the thickness is important (thin organic EL element is preferred), a microlens composed of the projection-depression layer having a corrugated structure or a Fresnel lens may be used as the optical functional layer 13. The optical functional layer 13 is used as a role of a lens for mainly controlling refraction of light, but is not limited to this; the optical functional layer 13 can also be used as a layer for giving a variety of optical properties such as convergence, diffusion (scattering), diffraction, and prevention of reflection of light.

The material for such an optical functional layer 13 is not particularly limited, and an optical member composed of any material can be used. As the optical functional layer 13, transparent inorganic materials such as glass, and transparent resin materials composed of transparent polymers like polyester resins such as polyethylene terephthalate, cellulose resins, acetate resins, polyether sulfone resins, polycarbonate resins, polyamide resins, polyimide resins, polyolefin resins, acrylic resins, and the like can be used, for example. Moreover, the optical functional layer 13 may be laminated on the support substrate 2 with the pressure-sensitive adhesive layer and/or adhesive layer being interposed therebetween so as not to contain the air between the organic EL element and the optical functional layer 13 to suppress reflection between the organic EL element and the optical functional layer 13.

Furthermore, from the viewpoint of enhancing friction resistance and scratch resistance of the surface of the optical functional layer 13, the optical functional layer 13 may have a protective layer laminated on the surface of the optical member (on the surface on which the shapes of projections and depressions are formed, in cases where a microlens composed of a projection-depression layer described above is used as the optical functional layer 13). As such a protective layer, a transparent film or a transparent inorganic deposition layer can be used. Such a transparent film is not particularly limited, and any transparent film can be used; examples thereof include films composed of transparent polymers like polyester resins such as polyethylene terephthalate, cellulose resins, acetate resins, polyether sulfone resins, polycarbonate resins, polyamide resins, polyimide resins, polyolefin resins, acrylic resins, and the like. Moreover, in such a transparent film, a pressure-sensitive adhesive layer or an adhesive layer may be formed on one surface thereof, and this transparent film may be bonded to the surface of the optical member and used (in cases where a microlens composed of a projection-depression layer described above is used as the optical functional layer 13, the transparent film may be bonded so as to form a space between projection portions). As such a pressure-sensitive adhesive or an adhesive, acrylic pressure-sensitive adhesives, ethylene-vinyl acetate copolymers, natural rubber pressure-sensitive adhesives, synthetic rubber pressure-sensitive adhesives composed of polyisobutylene, butyl rubber, styrene-butylene-styrene copolymers, styrene-isoprene-styrene block copolymers, and the like, polyurethane pressure-sensitive adhesives, and polyester pressure-sensitive adhesives may be used, for example.

Moreover, in cases where an inorganic deposition layer is laminated as the protective layer, known metal materials which can be formed into a transparent inorganic layer by deposition can be appropriately used; examples thereof include oxides, nitrides, sulfides of metals such as Sn, In, Te, Ti, Fe, Co, Zn, Ge, Pb, Cd, Bi, Se, Ga, and Rb. Moreover, $TiO_2$ can be suitably used as such a metal material from the viewpoint of sufficiently preventing deterioration due to oxidation, or ZnS can be suitably used from the viewpoint of attaining high luminance at low cost. Moreover, the method of forming such an inorganic deposition layer is not particularly limited, and the inorganic deposition layer can be appropriately manufactured by any physical deposition apparatus.

The organic EL elements 100 and 200 using the optical substrates 1 and 20 as diffraction grating substrates and the bottom emitting organic EL element 200 using the optical substrate 30 as a diffraction grating substrate have been described. However, the application of the optical substrates 1, 20, and 30 is not limited to the diffraction grating substrate of the bottom emitting organic EL element. The optical substrates 1, 20, and 30 can also be used, for example, in manufacturing of optical elements such as top emitting organic EL elements, LEDs, LECs, ECLs, solar cells, microlens arrays, prism arrays, and optical waveguides, optical parts such as lenses, anti-reflection films, viewing angle improving films, semiconductor chips, patterned media, data storages, electronic paper, LSIs, and the like, and can be applied to anti-fogging substrates, water-repellant substrates, hydrophilic substrates, dirt resistant substrates, anti-bacterial substrates, slip substrates, low impedance substrates for electric transmission lines, paper making, production of food products, and applications in the bio field and the like such as immune assay chips and cell culturing sheets. Moreover, the optical substrates 1, 20, and 30 can also be used, for example, in a variety of electronic devices, particularly, semiconductor integrated circuits, flat screens, microelectromechanical systems (MEMS), sensor elements, optical disks, magnetic recording media such as high density memory disks, optical parts such as diffraction gratings and relief holograms, nanodevices, optical devices, optical films and polarization elements for manufacturing of flat panel displays, thin film transistors for liquid crystal displays, organic transistors, color filters, overcoating layers, post materials, rib materials for orientating liquid crystals, microlens arrays, immune assay chips, DNA separation chips, microreactors, nanobiodevices, optical waveguides, optical filters, and photonic liquid crystals (see Japanese Unexamined Patent Publication No. 2013-46003).

Moreover, in cases where the widths of the projection portion of the projection-depression structure layer 3 are constant, destroy of the pattern is reduced during transfer of the projection-depression pattern from the metal mold 8 to the film-shaped mold 5 and transfer of the projection-depression pattern from the film-shaped mold 5 to the projection-depression structure layer 3, and it can be expected to stably perform transfer of the projection-depression pattern. Moreover, when the projection-depression pattern formed on the projection-depression portion 8a of the metal mold 8 is transferred onto the film-shaped mold 5, clogging of the resin applied onto the substrate portion 5a of the film-shaped mold 5 in the projection-depression portion 8a of the metal mold 8 can be reduced, and it can be expected to suppress deterioration of the metal mold 8. Moreover, when the projection-depression pattern formed on the projection-depression portion 5b of the film-shaped mold 5 is transferred onto the optical substrate 1, clogging of the undercoat material layer 4 applied onto the support substrate 2 in the projection-depression portion 5b of the film-shaped mold 5 can be reduced, and it can be expected to suppress deterioration of the film-shaped mold 5.

[Evaluation of Properties of Organic EL Elements Using Optical Substrates According to Examples and Comparative Examples]

Next, in organic EL elements using the optical substrates according to Examples and the optical substrates according to Comparative Examples of the present embodiment as diffraction grating substrates, the results of measurement and evaluation of current efficiency and leak current will be described.

Using the manufacturing method described above, six samples were produced on different production conditions, and analyzed images seen in planar view and FFT images of any measurement regions were obtained with an AFM (see FIG. 9 to FIG. 14). The average of the widths (nm) of the projection portion, the standard deviation of the width (nm) of the projection portion, the coefficient of variation of the width of the projection portion, the proportion (%) of the straight line section, and the standard deviation of the depth (nm) between a projection and a depression were then measured.

EXAMPLE 1

In this sample, a diffraction grating substrate (optical substrate having a projection-depression structure layer) is produced, and then an organic EL element is manufactured by using this diffraction grating substrate.

<Production of Film Mold>

First, to produce a diffraction grating substrate, Film mold M-1 having a surface with projections and depressions was produced by a BCP solvent annealing method. The following block copolymer made by Polymer Source Inc. and composed of polystyrene (hereinafter, appropriately abbreviated to "PS") and polymethyl methacrylate (hereinafter, appropriately abbreviated to "PMMA") was prepared.

Mn of PS segment=750000,
Mn of PMMA segment=720000,
Mn of block copolymer=1470000,
volume ratio (PS:PMMA) of PS segment to PMMA segment=54:46,
molecular weight distribution (Mw/Mn)=1.21, Tg of PS segment=107° C.,
Tg of PMMA segment=134° C.

The volume ratio (PS segment:PMMA segment) of the PS segment to the PMMA segment in the block copolymer was calculated where the density of polystyrene was 1.05 g/cm$^3$, and the density of polymethyl methacrylate was 1.19 g/cm$^3$. The number average molecular weight (Mn) and the weight average molecular weight (Mw) of the polymer segment or the polymer were measured by gel permeation chromatography (made by Tosoh Corporation, Model Nos. "GPC-8020", TSK-GEL SuperH1000, SuperH2000, SuperH3000, and SuperH4000 connected in series). The glass transition point (Tg) of the polymer segment was measured with a differential scanning calorimeter (made by PerkinElmer Inc., product name "DSC7") in the range of a temperature of 0 to 200° C. while the temperature was being raised at a temperature raising rate of 20° C./min. The solubility parameters of polystyrene and polymethyl methacrylate were 9.0 and 9.3, respectively (see Kagaku Binran Oyohen (Advanced Handbook of Chemistry), revised, the 2nd edition).

Toluene was added to 210 mg of the block copolymer and 52.5 mg of polyethylene glycol 2050 (average Mn=2050) made by Sigma-Aldrich Corporation as polyethylene oxide such that the total amount was 15 g, and these were dissolved to prepare a block copolymer solution.

This block copolymer solution was filtered through a membrane filter having a pore diameter of 0.5 μm, and a block copolymer solution was obtained. A mixed solution of 1 g of KBM-5103 made by Shin-Etsu Chemical Co., Ltd., 1 g of ion exchange water, 0.1 ml of acetic acid, and 19 g of isopropyl alcohol was applied onto a glass substrate by spin coating (performed at a rotational speed of 500 rpm for 10 seconds, and subsequently at 800 rpm for 45 seconds). A treatment was performed at 130° C. for 15 minutes and a silane coupling-treated glass was obtained. The resulting block copolymer solution was applied onto the silane coupling-treated glass as a base material by spin coating in a film thickness of 100 to 120 mm Spin coating was performed at a rotational speed of 200 rpm for 10 seconds, and subsequently at 300 rpm for 30 seconds.

Next, the base material having a thin film formed thereon was left to stand at room temperature for 24 hours in a desiccator preliminarily filled with steam of chloroform to perform solvent annealing. A screw bottle filled with 100 g of chloroform was placed in the desiccator (volume: 5 L), and the atmosphere within the desiccator was filled with chloroform at saturated vapor pressure. Projections and depressions were observed on the surface of the thin film after solvent annealing, and it was found that the block copolymer forming the thin film was micro layer separated. The cross section of the thin film was observed with a transmission electron microscope (TEM) (H-7100FA made by Hitachi, Ltd.); then, the circular cross sections of PS portions were spaced from each other in directions parallel to the surface of the substrate and were aligned in two rows in the direction vertical to the surface of the substrate (height direction), and it was found that the PS portions were phase separated from PMMA portions as horizontal cylindrical structures from examination in combination with an analyzed image obtained with an atomic force microscope. The PS portions became cores (islands) and were surrounded with the PMMA portions (sea).

A thin nickel layer of about 20 nm was formed as a current seed layer by sputtering on the surface of the thin film having a waveform formed by the above solvent annealing. Next, the base material with the thin film was placed in a nickel sulfamate bath and was subjected to electrocasting (maximum current density: 0.05 A/cm$^2$) at a temperature of 50° C. to deposit nickel until the thickness reached 250 μm. The base material with the thin film was mechanically released from the resulting nickel electrocasted body. Next, the nickel electrocasted body was immersed in a solvent of tetrahydrofuran for 2 hours, an acrylic UV curable resin was then applied and was hardened, and releasing was performed; this operation was repeated three times to remove polymer components partially adhering to the surface of the electrocasted body. Subsequently, the nickel electrocasted body was immersed in Chemisol 2303 made by The Japan Cee-Bee Chemical Co., Ltd. and was washed while stirring was being performed at 50° C. for 2 hours. Subsequently, the nickel electrocasted body was subjected to a UV ozone treatment for 10 minutes.

Next, the nickel electrocasted body was immersed in HD-2101TH made by DAIKIN CHEMICALS SALES, LTD. for about 1 minute, was dried, and was then left to stand overnight. On the following day, the nickel electrocasted body was immersed in HDTH made by DAIKIN CHEMICALS SALES, LTD. and was subjected to an ultrasonic treatment washing for about 1 minute. A nickel mold subjected to a release treatment was thus obtained.

Next, a fluorine-containing UV curable resin was applied onto a PET substrate (made by TOYOBO CO., LTD., COSMOSHINE A-4100); while the nickel mold was being pressed against the fluorine-containing UV curable resin, the fluorine-containing UV curable resin was irradiated with ultraviolet light at 600 mJ/cm$^2$ and the fluorine-containing UV curable resin was hardened. After the resin was hardened, the nickel mold was released from the cured resin. Film mold M-1 composed of a PET substrate provided with a resin film having the surface shape of the nickel mold transferred thereon was thus obtained.

<Formation of Projection-Depression Structure Layer>

3.74 g of tetraethoxysilane (TEOS) and 0.89 g of methyltriethoxysilane (MTES) were added dropwise to a mixed solution of 24.3 g of ethanol, 2.15 g of water, and 0.0098 g of concentrated hydrochloric acid as materials, the resulting solution was stirred at 23° C. and a humidity of 45% for 2 hours, and a sol gel material solution of $SiO_2$ was obtained. This sol gel material solution was applied onto a non-alkali glass substrate (made by Nippon Electric Glass Co., Ltd., OA10GF) measuring 10×10×0.07 cm by bar coating to form a coating. A doctor blade (made by YOSHIMITSU SEIKI) was used as a bar coater. This doctor blade was designed to form a coating having a film thickness of 5 µm, but the film thickness of the coating was adjusted to 40 µm by bonding an imide tape having a thickness of 35 µm to the doctor blade. After 60 seconds after application of the sol gel material solution, Film mold M-1 produced as above was moved while being rotated and pressed against the coating (undercoat material layer) on the glass plate with a pressurizing roll heated to 80° C. After pressing of the coating was completed, Film mold M-1 was released; next, heating at 300° C. was performed using an oven for 60 minutes to perform main calcination. A projection-depression structure layer having a projection-depression pattern transferred from Film mold M-1 was thereby formed on the glass substrate. As the pressurizing roll, a roll provided with a heater inside thereof, having an outer periphery coated with a heat-resistant silicone having a thickness of 4 mm, and having a roll diameter ϕ of 50 mm and an axial length of 350 mm was used.

Regarding the projection-depression pattern of the projection-depression structure layer, an analyzed image of the shapes of projections and depressions of the surface thereof was obtained with an atomic force microscope (scanning probe microscope with an environment control unit "Nano-navilI StationlE-sweep" made by Hitachi High-Tech Science Corporation). The analysis conditions of the atomic force microscope are as follows:

Mode for measurement: dynamic force mode
cantilever: SI-DF40 (material: Si, width of lever: 40 µm, diameter of
chip distal end: 10 nm)
Atmosphere for measurement: in the air
Temperature for measurement: 25° C.

<Average Depth of the Depths Between Projections and Depressions>

A measurement region of 3 µm square (length: 3 µm, width: 3 µm) at any position of the projection-depression structure layer was measured to determine an analyzed image of projections and depressions as described above. In such an analyzed image of projections and depressions, the distance in the depth direction between the bottom portion of any depression portion and the vertex portion of its adjacent projection portion was measured at 100 or more points; the average of the distances was calculated and was defined as the average depth of the depths between projections and depressions. In the analyzed image obtained in this example, the average depth of the depths between projections and depressions in the projection-depression structure layer was 54 nm.

<Fourier Transformed Image of Analyzed Image of Projections and Depressions>

Any measurement region of a 3 µm square (length: 3 µm, width: 3 µm) of the projection-depression structure layer was measured and an analyzed image of projections and depressions was determined as described above. The resulting analyzed image of projections and depressions was subjected to flat processing including primary inclination correction and then was subjected to two-dimensional high-speed Fourier transformation to obtain a Fourier transformed image. As illustrated in (b) of FIG. 10, the Fourier transformed image thus obtained shows a circular pattern in which an origin having an absolute value of a wavenumber of 0 µm$^{-1}$ is approximately in the center, and it was verified that the circular pattern was present within the region having an absolute value of a wavenumber within the range of 10 µm$^{-1}$ or less.

<Average Pitch of Projections and Depressions>

Any measurement region of a 3 µm square (length: 3 µm, width: 3 µm) of the projection-depression structure layer was measured and an analyzed image of projections and depressions was determined as described above. In such an analyzed image of projections and depressions, the 100 or more intervals between the vertex portions of any adjacent projection portions or between the bottom portions of adjacent depression portions were measured; the average of the intervals was calculated and was defined as the average pitch of projections and depressions. In the analyzed image obtained in this example, the average pitch of projections and depressions of the projection-depression structure layer was 338 nm.

<Average of Distribution of Depth Between Projection and Depression>

Any measurement region of a 3 µm square (length: 3 µm, width: 3 µm) of the projection-depression structure layer was measured and an analyzed image of projections and depressions was determined. At this time, each data on the depth between a projection and a depression at 16384 points (128 points in length×128 points in width) or more measurement points in a measurement region was determined in a scale of nanometer. In E-sweep used in this Example, 65536 points (256 points in length×256 points in width) were measured (measured at a resolution of 256×256 pixels) in a measurement region of 3 µm square. In the depth (rim) between a projection and a depression thus measured, first, among all of the measurement points, the measurement point P having the largest height from the surface of the substrate was determined. A plane containing the measurement point P and parallel to the surface of the substrate was determined as a reference plane (level plane); the depth value from the reference plane (difference obtained by subtracting the height from the substrate at each measurement point from the height value from the substrate at the measurement point P) was determined as the data on the depth between a projection and a depression. Such data on the depth between a projection and a depression can be determined through automatic calculation with software in E-sweep, and such a value determined through automatic calculation can be used as the data on the depth between a projection and a depression. After the data on the depth between a projection and a depression at each measurement point is determined as described above, the average (m) of distribution of the depth between a projection and a depression can be determined through calculation using the following expression (I):

[Expression 1]

$$m = \frac{1}{N}\sum_{i=1}^{N} x_i \quad (I)$$

[where N represents the total number of measurement points; $x_i$ represents the data on the depth between a projection and a depression of the i-th measurement point.]

The average (m) of distribution of the depth between a projection and a depression of the projection-depression structure layer obtained from this sample was 43.2 nm.

<Standard Deviation of Depth Between Projection and Depression>

At 16384 points (128 points in length×128 points in width) or more measurement points in a measurement region of a 3 μm square in the projection-depression structure layer, the data on the depth between a projection and a depression was determined in the same manner as in that of the method of measuring the average (m) of depth distribution described above. In this example, measurement points of 65536 points (256 points in length×256 points in width) were used. Subsequently, based on the data on the depth between a projection and a depression at each measurement point, the average (m) of distribution of the depth between a projection and a depression and the standard deviation (σ) of the depth between a projection and a depression were calculated. The average (m) can be determined through calculation using the above expression (I) as described above. In contrast, the standard deviation (σ) of the depth between a projection and a depression can be determined through calculation using the following expression (II):

[Expression 2]

$$\sigma = \sqrt{\frac{1}{N}\sum_{i=1}^{N}(x_i - m)^2} \quad (II)$$

[where N represents the total number of measurement points (the total number of pixels); $x_i$ represents the data on the depth between a projection and a depression at the i-th measurement point; m represents the average of distribution of the depth between a projection and a depression.]

The standard deviation (σ) of the depth between a projection and a depression of the projection-depression structure layer obtained from this sample was 20.2 nm.

<Average of Width of Projection Portion, Standard Deviation of Width of Projection Portion, Coefficient of Variation of Width of Projection Portion>

Where a region having the depth between a projection and a depression equal to or more than the average of distribution of the depth between a projection and a depression was defined as a projection portion, and a region having a depth between a projection and a depression less than the average of distribution of the depth between a projection and a depression was defined as a depression portion, an analyzed image of projections and depressions was processed such that the projection portion was indicated by white, and the depression portion was indicated by black to obtain an analyzed image seen in planar view (monochromatic image) as illustrated in (a) of FIG. 10. Any 100 or more projection portions were selected from the projection portions of the analyzed image seen in planar view, and the length from the boundary of each of the projection portions to the opposite boundary in the direction approximately orthogonal to the extending direction of the projection portion seen in planar view was measured. As described above, the values at branched places of the projection portion were excluded from the measurement values. The arithmetic average of the lengths thus measured was determined to calculate the average of the widths of the projection portion. The average of the widths of the projection portion obtained in this example was 162.5 nm. Moreover, the standard deviation of the width of the projection portion was 24.4 nm. Furthermore, the coefficient of variation of the width of the projection portion (standard deviation of the width of the projection portion/average of the widths of the projection portion) was calculated by dividing the standard deviation of the width of the projection portion by the average of the widths of the projection portion. The coefficient of variation of the width of the projection portion of this sample was 0.15, and it was verified that the width condition was satisfied.

<Proportion of Straight Line Section in First Definition Method>

In the analyzed image seen in planar view illustrated in (a) of FIG. 10, the proportion of the straight line section in the first method of defining a curved line section was calculated according to the above-mentioned procedures (Procedure 1-1 to Procedure 1-6). The proportion of the straight line section in first definition method of this sample was 84.0%, and it was verified that the straight line condition was satisfied in the first definition method.

<Proportion of Straight Line Section in Second Definition Method>

In the analyzed image seen in planar view illustrated in (a) of FIG. 10, the proportion of the straight line section in the second method of defining a curved line section was calculated according to the above-mentioned procedures (Procedure 2-1 to Procedure 2-6). The proportion of the straight line section in second definition method of this sample was 92.5%, and it was verified that the straight line condition was satisfied in the second definition method.

As above, this sample satisfies the width condition and the straight line condition, and therefore it can be said that this sample is an Example according to the present embodiment (Example 1).

<Production of Organic EL Element>

Next, ITO was deposited by sputtering in a thickness of 120 nm on a diffraction grating substrate including the projection-depression pattern layer obtained above; next, as organic layers, a hole transport layer (4,4',4"tris(9-carbazole)triphenylamine, thickness: 35 nm), a light emitting layer (4,4',4"tris(9-carbazole)triphenylamine doped with a tris(2-phenylpyridinato)iridium(III) complex, thickness: 15 nm, 1,3,5-tris(N-phenylbenzimidazol-2-yl)benzene doped with a tris(2-phenylpyridinato)iridium (III) complex, thickness: 15 nm), and an electron transport layer (1,3,5-tris(N-phenylbenzimidazol-2-yl)benzene, thickness: 65 nm) were each laminated by deposition. Furthermore, a lithium fluoride layer (thickness: 1.5 nm) and a metal electrode (aluminum, thickness: 50 nm) were deposited. As illustrated in FIG. 8, an organic EL element was thus obtained, in which the projection-depression structure layer 3, the coating layer 9, the first electrode 10, the organic layer 11, and a metal electrode as the second electrode 12 were each formed on the support substrate 2.

In the table of FIG. 16, the measurement values of the projection-depression structure layer of the organic EL element obtained in Example 1 (the average of the widths of the projection portion, the standard deviation of the width of the projection portion, the coefficient of variation of the width of the projection portion, the length of one side of the measurement region, the proportion of the straight line section in the first definition method, the proportion of the straight line section in the second definition method, and the standard deviation of the depth between a projection and a depression) are each shown.

EXAMPLE 2

<Production of Film Mold>

First, to produce a diffraction grating substrate, Film mold M-2 having a surface with projections and depressions was produced by the BCP solvent annealing method. To produce Film mold M-2, the following block copolymer made by Polymer Source Inc. and composed of polystyrene and polymethyl methacrylate was prepared. Then, toluene was added to 225 mg of the block copolymer and 56.3 mg of polyethylene glycol 2050 made by Sigma-Aldrich Corporation as polyethylene oxide such that the total amount was 15 g, and these were dissolved to prepare a block copolymer solution. The block copolymer solution was then applied onto a base material in a film thickness of 100 to 120 nm. Except for these, Film mold M-2 was produced by the same method on the same condition as those in Film mold M-1 produced in Example 1.

Mn of PS segment=590000,
Mn of PMMA segment=570000,
Mn of block copolymer=1160000,
Volume ratio (PS:PMMA) of PS segment to PMMA segment=54:46,
molecular weight distribution (Mw/Mn)=1.25, Tg of PS segment=107° C.,
Tg of PMMA segment=134° C.

<Formation of Projection-Depression Structure Layer>

A projection-depression structure layer was formed in the same manner as in Example 1 except that Film mold M-2 was used instead of using Film mold M-1.

<Measurement Results>

An analyzed image of projections and depressions, a Fourier transformed image of an analyzed image of projections and depressions (see (b) of FIG. 11), and an analyzed image seen in planar view (see (a) of FIG. 11) were obtained in the same manner as in Example 1. In this analyzed image of projections and depressions, the average depth of the depths between projections and depressions was 95 nm. Moreover, as illustrated in (b) of FIG. 11, the Fourier transformed image of an analyzed image of projections and depressions shows a circular pattern in which an origin having an absolute value of a wavenumber of 0 $\mu m^{-1}$ is approximately in the center, and it was verified that the circular pattern was present within the region having an absolute value of a wavenumber within the range of 10 $\mu m^{-1}$ or less. Moreover, from the analyzed image of projections and depressions and the analyzed image seen in planar view illustrated in (a) of FIG. 11, it was verified that the average pitch of projections and depressions was 305 nm, the average (m) of distribution of the depth between a projection and a depression was 57.3 nm, the standard deviation of the depth between a projection and a depression was 31.7 nm, the average of the widths of the projection portion was 148.8 nm, the standard deviation of the width of the projection portion was 15.8 nm, the coefficient of variation of the width of the projection portion was 0.11, the proportion of the straight line section in the first definition method was 88.4%, and the proportion of the straight line section in the second definition method was 92.2%. Namely, this sample satisfies the width condition and satisfies the straight line condition in both of the first and second definition methods; accordingly, it can be said that this sample is an Example of the present embodiment (Example 2).

<Production of Organic EL Element

An organic EL element was produced in the same manner as in Example 1 using the diffraction grating substrate including the projection-depression structure layer, which was produced above. In the table of FIG. 16, the measurement values of the projection-depression structure layer of the organic EL element obtained in Example 2 (the average of the widths of the projection portion, the standard deviation of the width of the projection portion, the coefficient of variation of the width of the projection portion, the length of one side of the measurement region, the proportion of the straight line section in the first definition method, the proportion of the straight line section in the second definition method, and the standard deviation of the depth between a projection and a depression) are each shown.

EXAMPLE 3

<Production of Film Mold>

First, to produce a diffraction grating substrate, Film mold M-3 having a surface with projections and depressions was produced by the BCP solvent annealing method. To produce Film mold M-3, the following block copolymer made by Polymer Source Inc. and composed of polystyrene and polymethyl methacrylate was prepared. Then, toluene was added to 225 mg of the block copolymer and 56.3 mg of polyethylene glycol 2050 made by Sigma-Aldrich Corporation as polyethylene oxide such that the total amount was 15 g, and these were dissolved to prepare a block copolymer solution. The block copolymer solution was then applied onto a base material in a film thickness of 140 to 160 nm. Except for these, Film mold M-3 was produced by the same method on the same condition as those in Film mold M-1 produced in Example 1.

Mn of PS segment=680000,
Mn of PMMA segment=580000,
Mn of block copolymer=1260000,
Volume ratio (PS:PMMA) of PS segment to PMMA segment=57:43,
molecular weight distribution (Mw/Mn)=1.28, Tg of PS segment=107° C.,
Tg of PMMA segment=134° C.

<Formation of Projection-Depression Structure Layer>

A projection-depression structure layer was formed in the same manner as in Example 1 except that Film mold M-3 was used instead of using Film mold M-1.

<Measurement Results>

An analyzed image of projections and depressions, a Fourier transformed image of an analyzed image of projections and depressions (see (b) of FIG. 12), and an analyzed image seen in planar view (see (a) of FIG. 12) were obtained in the same manner as in Example 1. A measurement region of a 10 µm square (length: 10 µm, width: 10 µm) was measured to determine an analyzed image of projections and depressions. In this analyzed image of projections and depressions, the average depth of the depths between projections and depressions was 91 nm. Moreover, as illustrated in (b) of FIG. 12, the Fourier transformed image of an analyzed image of projections and depressions shows a circular pattern in which an origin having an absolute value of a wavenumber of 0 µm$^{-1}$ is approximately in the center, and it was verified that the circular pattern was present within the region having an absolute value of a wavenumber within the range of 10 µm$^{-1}$ or less. Moreover, from the analyzed image of projections and depressions and the analyzed image seen in planar view illustrated in (a) of FIG. 12, it was verified that the average pitch of projections and depressions was 562 nm, the average (m) of distribution of the depth between a projection and a depression was 62.5 nm, the standard deviation of the depth between a projection and a depression was 29.7 nm, the average of the widths of the projection portion was 251.2 nm, the standard deviation of the width of the projection portion was 48.8 nm, the coefficient of variation of the width of the projection portion was 0.19, the proportion of the straight line section in the first definition method was 76.2%, and the proportion of the straight line section in the second definition method was 81.2%. Namely, this sample satisfies the width condition and satisfies the straight line condition in both of the first and second definition methods; accordingly, it can be said that this sample is an Example of the present embodiment (Example 3).

<Production of Organic EL Element>

An organic EL element was produced in the same manner as in Example 1 using the diffraction grating substrate including the projection-depression structure layer, which was produced above. In the table of FIG. 16, the measurement values of the projection-depression structure layer of the organic EL element obtained in Example 3 (the average of the widths of the projection portion, the standard deviation of the width of the projection portion, the coefficient of variation of the width of the projection portion, the length of one side of the measurement region, the proportion of the straight line section in the first definition method, the proportion of the straight line section in the second definition method, and the standard deviation of the depth between a projection and a depression) are each shown.

EXAMPLE 4

<Production of Film Mold>

First, to produce a diffraction grating substrate, Film mold M-4 having a surface with projections and depressions was produced by the BCP solvent annealing method. To produce Film mold M-4, the following block copolymer made by Polymer Source Inc. and composed of polystyrene and polymethyl methacrylate was prepared. Then, toluene was added to 240 mg of the block copolymer and 60.0 mg of polyethylene glycol 2050 made by Sigma-Aldrich Corporation as polyethylene oxide such that the total amount was 15 g, and these were dissolved to prepare a block copolymer solution. The block copolymer solution was then applied onto a base material in a film thickness of 170 to 190 nm. Except for these, Film mold M-4 was produced by the same method on the same condition as those in Film mold M-1 produced in Example 1.

Mn of PS segment=900000,
Mn of PMMA segment=800000,
Mn of block copolymer=1700000,
Volume ratio (PS:PMMA) of PS segment to PMMA segment=55:45, molecular weight distribution (Mw/Mn)= 1.26, Tg of PS segment=107° C.,
Tg of PMMA segment=134° C.

<Formation of Projection-Depression Structure Layer>

A projection-depression structure layer was formed in the same manner as in Example 3 except that Film mold M-4 was used instead of using Film mold M-3.

<Measurement Results>

Figure 13:
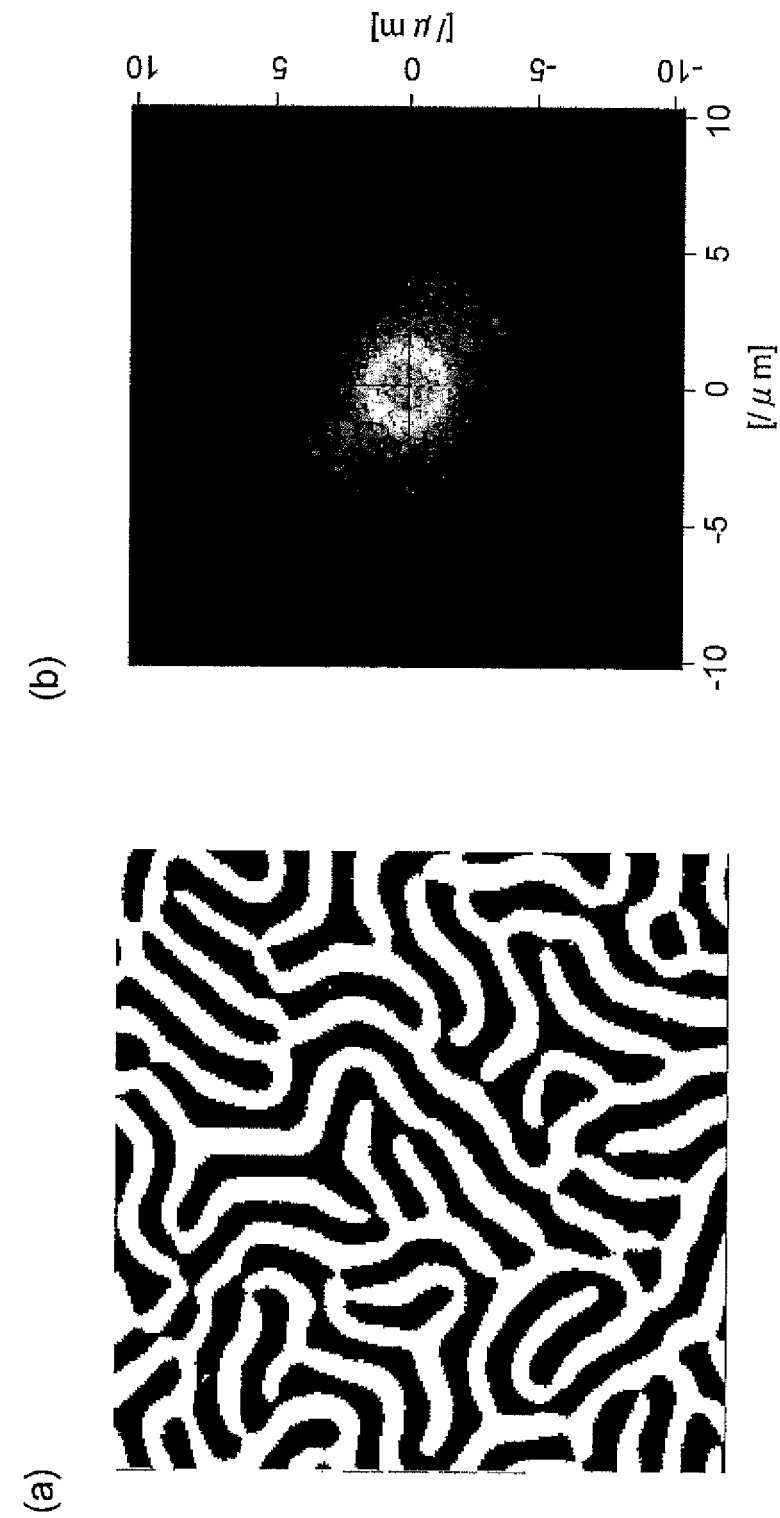
FIG. 13(a) is an analyzed image seen in planar view of the surface of a projection-depression structure layer in the optical substrate according to Example 4.
FIG. 13(b) is a diagram illustrating an FFT image thereof.

An analyzed image of projections and depressions, a Fourier transformed image of an analyzed image of projections and depressions (see (b) of FIG. 13), and an analyzed image seen in planar view (see (a) of FIG. 13) were obtained in the same manner as in Example 3. In this analyzed image of projections and depressions, the average depth of the depths between projections and depressions was 138 nm. Moreover, as illustrated in (b) of FIG. 13, the Fourier transformed image of an analyzed image of projections and depressions shows a circular pattern in which an origin having an absolute value of a wavenumber of 0 µm$^{-1}$ is approximately in the center, and it was verified that the circular pattern was present within the region having an absolute value of a wavenumber within the range of 10 µm$^{-1}$ or less. Moreover, from the analyzed image of projections and depressions and the analyzed image seen in planar view illustrated in (a) of FIG. 13, it was verified that the average pitch of projections and depressions was 767 nm, the average (m) of distribution of the depth between a projection and a depression was 78.9 nm, the standard deviation of the depth between a projection and a depression was 46.7 nm, the average of the widths of the projection portion was 370.9 nm, the standard deviation of the width of the projection portion was 54.5 nm, the coefficient of variation of the width of the projection portion was 0.15, the proportion of the straight line section in the first definition method was 78.5%, and the proportion of the straight line section in the second definition method was 79.7%. Namely, this sample satisfies the width condition and satisfies the straight line condition in both of the first and second definition methods; accordingly, it can be said that this sample is an Example of the present embodiment (Example 4).

<Production of Organic EL Element>

An organic EL element was produced in the same manner as in Example 1 using the diffraction grating substrate including the projection-depression structure layer, which was produced above. In the table of FIG. 16, the measurement values of the projection-depression structure layer of the organic EL element obtained in Example 4 (the average of the widths of the projection portion, the standard deviation of the width of the projection portion, the coefficient of variation of the width of the projection portion, the length of one side of the measurement region, the proportion of the straight line section in the first definition method, the proportion of the straight line section in the second definition method, and the standard deviation of the depth between a projection and a depression) are each shown.

COMPARATIVE EXAMPLE 1

<Production of Film Mold>

First, a silicone polymer [a mixed resin composition of 90% by mass silicone rubber (made by Wacker-Chemie AG; product name "Elastosil RT601") and 10% by mass curing agent] was applied onto a base material (material: glass) by spin coating and was hardened by heating at 100° C. for 1 hour and a silicone polymer film was formed.

Next, an aluminum deposited film (thickness: 10 nm) was formed on the silicone polymer film by deposition under the condition at a temperature of 100° C. and a pressure of 1×10$^{-3}$ Pa; subsequently, the aluminum deposited film was cooled to room temperature (25° C.) over 30 minutes, and the pressure was then returned to atmospheric pressure (1.013×10⁵ Pa). Projections and depressions were formed on the surface of the aluminum deposited film formed on the silicone polymer film. Next, a silicone polymer [a mixed resin composition of 90% by mass silicone rubber (made by Wacker-Chemie AG, product name "Elastosil RT601") and 10% by mass curing agent] was applied onto the aluminum deposited film by dropping, was hardened by heating at 100° C. for 1 hour, and was then removed from the aluminum deposited film to obtain Master (M-5A).

Next, an aluminum deposited film (thickness: 10 nm) was formed on Master (M-5A), which had a surface on which projections and depressions were formed, by deposition under the condition at a temperature of 100° C. and a pressure of 1×10⁻³ Pa; subsequently, the aluminum deposited film was cooled to room temperature (25° C.) over 30 minutes, and the pressure was then returned to atmospheric pressure (1.013×10⁵ Pa). Projections and depressions were formed on the surface of the aluminum deposited film formed on Master (M-5A). Next, a silicone polymer [a mixed resin composition of 90% by mass silicone rubber (made by Wacker-Chemie AG, product name "Elastosil RT601") and 10% by mass curing agent] was applied onto the aluminum deposited film by dropping, was hardened by heating at 100° C. for 1 hour, and was then removed from the aluminum deposited film to obtain Master (M-5B). Furthermore, an aluminum deposited film (thickness: 10 nm) was formed on Master (M-5B), which had a surface on which projections and depressions were formed, by deposition under the condition at a temperature of 100° C. and a pressure of 1×10⁻³ Pa; subsequently, the aluminum deposited film was cooled to room temperature (25° C.) over 30 minutes, and the pressure was then returned to atmospheric pressure (1.013×10⁵ Pa). Projections and depressions were formed on the surface of the aluminum deposited film formed on Master (M-5B). Next, a silicone polymer [a mixed resin composition of 90% by mass silicone rubber (made by Wacker-Chemie AG, product name "Elastosil RT601") and 10% by mass curing agent] was applied onto the aluminum deposited film by dropping, was hardened by heating at 100° C. for 1 hour, and was then removed from the aluminum deposited film to obtain Master (M-5C).

Next, a glass substrate (made by Matsunami Glass Ind., Ltd., product name "Micro slide glass") and a curable resin (made by Norland Optical Adhesive Inc., product name "NOA 81") were prepared, and the curable resin was applied onto the glass substrate; subsequently, while Master (M-5C) was being pressed against the curable resin, the curable resin was hardened through irradiation with ultraviolet light for 1 hour. Subsequently, Master (M-5C) was removed from the cured resin layer after hardening to obtain Master (M-5D) including a cured resin layer having projections and depressions formed on the glass substrate. Master (M-5D) was subjected to the same operation as that in Example 1 to obtain an Ni electrocasted body (M-5E) and then film mold (M-5F).

<Formation of Projection-Depression Structure Layer>

A projection-depression structure layer was formed in the same manner as in Example 1 except that Film mold M-5F was used instead of using Film mold M-1.

<Measurement Results>

An analyzed image of projections and depressions, a Fourier transformed image of an analyzed image of projections and depressions (see (b) of FIG. 14), and an analyzed image seen in planar view (see (a) of FIG. 14) were obtained in the same manner as in Example 1. In this analyzed image of projections and depressions, the average depth of the depths between projections and depressions was 59 nm. Moreover, as illustrated in (b) of FIG. 14, the Fourier transformed image of an analyzed image of projections and depressions shows a circular pattern in which an origin having an absolute value of a wavenumber of 0 μm⁻¹ is approximately in the center, and it was verified that the circular pattern was present within the region having an absolute value of a wavenumber within the range of 10 μm⁻¹ or less. Moreover, from the analyzed image of projections and depressions and the analyzed image seen in planar view illustrated in (a) of FIG. 14, it was verified that the average pitch of projections and depressions was 372 nm, the average (m) of distribution of the depth between a projection and a depression was 46.5 nm, the standard deviation of the depth between a projection and a depression was 19.8 nm, the average of the widths of the projection portion was 146.3 nm, the standard deviation of the width of the projection portion was 51.4 nm, the coefficient of variation of the width of the projection portion was 0.35, the proportion of the straight line section in the first definition method was 47.4%, and the proportion of the straight line section in the second definition method was 56.8%. Namely, this sample does not satisfy the width condition, and does not satisfy the straight line condition in both of the first and second definition methods; accordingly, it can be said that this sample is Comparative Example of the present embodiment (Comparative Example I).

<Production of Organic EL Element>

An organic EL element was produced in the same manner as in Example 1 using the diffraction grating substrate including the projection-depression structure layer, which was produced above. In the table of FIG. 16, the measurement values of the projection-depression structure layer of the organic EL element obtained in Comparative Example 1 (the average of the widths of the projection portion, the standard deviation of the width of the projection portion, the coefficient of variation of the width of the projection portion, the length of one side of the measurement region, the proportion of the straight line section in the first definition method, the proportion of the straight line section in the second definition method, and the standard deviation of the depth between a projection and a depression) are each shown.

COMPARATIVE EXAMPLE 2

<Production of Film Mold>

First, to produce a diffraction grating substrate, a film mold having a surface with projections and depressions was produced by a method using silicone rubber. Film mold M-6 was produced by the same method on the same condition as those in Film mold M-5F produced in Comparative Example 1 except that the thickness of the aluminum deposited film formed on the silicone polymer film was 30 nm rather than 10 nm.

<Formation of Projection-Depression Structure Layer>

A projection-depression structure layer was formed in the same manner as in Example 3 except that Film mold M-6 was used instead of using Film mold M-3.

<Measurement Results>

Figure 15:
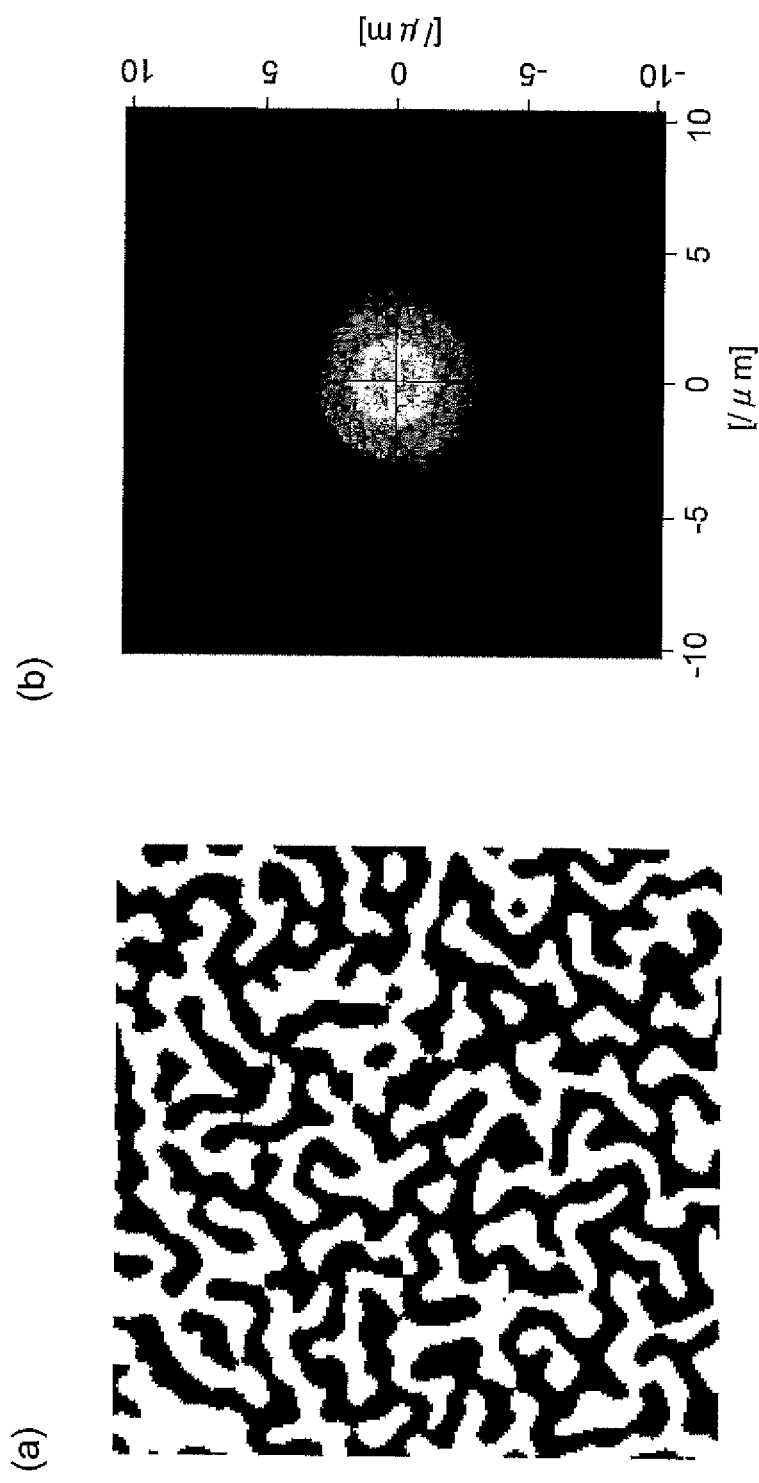
FIG. 15(a) is an analyzed image seen in planar view of the surface of a projection-depression structure layer in the optical substrate according to Comparative Example 2.
FIG. 15(b) is a diagram illustrating an FFT image thereof.

An analyzed image of projections and depressions, a Fourier transformed image of an analyzed image of projections and depressions (see (b) of FIG. 15), and an analyzed image seen in planar view (see (a) of FIG. 15) were obtained in the same manner as in Example 3. In this analyzed image of projections and depressions, the average depth of the depths between projections and depressions was 142 nm.

Moreover, as illustrated in (b) of FIG. 15, the Fourier transformed image of an analyzed image of projections and depressions shows a circular pattern in which an origin having an absolute value of a wavenumber of 0 µm$^{-1}$ is approximately in the center, and it was verified that the circular pattern was present within the region having an absolute value of a wavenumber within the range of 10 µm$^{-1}$ or less. Moreover, from the analyzed image of projections and depressions and the analyzed image seen in planar view illustrated in (a) of FIG. 15, it was verified that the average pitch of projections and depressions was 784 nm, the average (m) of distribution of the depth between a projection and a depression was 81.6 nm, the standard deviation of the depth between a projection and a depression was 45.7 nm, the average of the widths of the projection portion was 396.7 nm, the standard deviation of the width of the projection portion was 127.0 nm, the coefficient of variation of the width of the projection portion was 0.32, the proportion of the straight line section in the first definition method was 48.3%, and the proportion of the straight line section in the second definition method was 59.6%. Namely, this sample does not satisfy the width condition, and does not satisfy the straight line condition in both of the first and second definition methods; accordingly, it can be said that this sample is Comparative Example of the present embodiment (Comparative Example 2).

<Production of Organic EL Element?

An organic EL element was produced in the same manner as in Example 1 using the diffraction grating substrate including the projection-depression structure layer, which was produced above. In the table of FIG. 16, the measurement values of the projection-depression structure layer of the organic EL element obtained in Comparative Example 2 (the average of the widths of the projection portion, the standard deviation of the width of the projection portion, the coefficient of variation of the width of the projection portion, the length of one side of the measurement region, the proportion of the straight line section in the first definition method, the proportion of the straight line section in the second definition method, and the standard deviation of the depth between a projection and a depression) are each shown.

(Method of Evaluating Current Efficiency)

In the organic EL elements according to Examples 1 to 4 and Comparative Examples 1 and 2, the current efficiency at a luminance of 1000 cd/m$^2$ was determined, and the magnification of the current efficiency of each organic EL element to the current efficiency of an organic EL element using a flat blank glass substrate not including a projection-depression structure as an optical substrate was calculated. The results are shown in FIG. 16. The results shows that as the magnification is higher, the current efficiency is better. In the table of FIG. 16, those having a magnification of 1.1 to 1.3 times are expressed by "C", those having a magnification of 1.3 to 1.5 times are expressed by "B", and those having a magnification of more than 1.5 times are expressed by "A". The current efficiency was measured by the following method. A voltage was applied to the organic EL element, the applied voltage V and the current I flowing in the organic EL element were measured with an application measurement device (made by ADC CORPORATION, R6244), and the amount of total luminous flux L was measured with a total luminous flux measurement apparatus made by Spectra Co-op, Inc. The luminance value L' was calculated from the measurement values of the applied voltage V, the current I, and the amount of total luminous flux L thus obtained; for current efficiency, using the following calculation expression (F1):

$$\text{current efficiency}=(L'/I)\times S \quad (F1)$$

the current efficiency of the organic EL element was calculated. In the above expression, S is a light emission area of an element. The luminance value L' was converted using the following calculation expression (F2), assuming that orientation properties of the organic EL element conforms to Law of Lambert-Beer.

$$L'=L/\pi/S \quad (F2)$$

(Method of Evaluating Leak Current)

A low voltage (1.0 V) at an extent that an element did not emit light was applied to each of the organic EL elements according to Examples 1 to 4 and Comparative Examples 1 and 2, and the current flowing in the organic EL element was measured with an application measurement device (made by Keithley Instruments, Inc., 2612A SYSTEM Source Meter). The measured current value was divided by the light emission area of the organic EL element and the current density was calculated. In the table of FIG. 16, those having a current density of less than 5.0×10$^{-6}$ A/cm$^2$ when a voltage of 1.0 V is applied are expressed by "A", and those having a current density of 5.0×10$^{-6}$ A/cm$^2$ or more when a voltage of 1.0 V is applied are expressed as "B".

[Current Efficiency and leak Current in Comparative Examples]

As illustrated in FIG. 16, the current efficiency of the organic EL element using the optical substrate according to Comparative Example 1 was evaluated as "C". Moreover, the leak current of the organic EL element using the optical substrate according to Comparative Example 1 was evaluated as "B".

Moreover, as illustrated in FIG. 16, the current efficiency of the organic EL element using the optical substrate according to Comparative Example 2 was evaluated as "B". Moreover, the leak current of the organic EL element using the optical substrate according to Comparative Example 2 was evaluated as "B".

(Current Efficiency And Leak Current In Examples)

Moreover, as illustrated in FIG. 16, the current efficiency of the organic EL element using the optical substrate according to Example 1 was evaluated as "B". Moreover, the leak current of the organic EL element using the optical substrate according to Example 1 was evaluated as "A".

Moreover, as illustrated in FIG. 16, the current efficiency of the organic EL element using the optical substrate according to Example 2 was evaluated as "A". Moreover, the leak current of the organic EL element using the optical substrate according to Example 2 was evaluated as "A".

Moreover, as illustrated in FIG. 16, the current efficiency of the organic EL element using the optical substrate according to Example 3 was evaluated as "A". Moreover, the leak current of the organic EL element using the optical substrate according to Example 3 was evaluated as "A".

Moreover, as illustrated in FIG. 16, the current efficiency of the organic EL element using the optical substrate according to Example 4 was evaluated as "A". Moreover, the leak current of the organic EL element using the optical substrate according to Example 4 was evaluated as "A".

(Comparison between Example 1 and Comparative Example 1)

Comparing the organic EL element using the optical substrate according to Example 1 and the organic EL element using the optical substrate according to Comparative Example 1, it was verified that the organic EL element according to Example 1 showed higher current efficiency than that of the organic EL element according to Comparative Example 1. Namely, it was verified that higher current efficiency is attained if the straight line condition and the width condition are satisfied. Also the leak current of the organic EL element according to Example 1 was smaller than that of the organic EL element according to Comparative Example 1, and had good results.

(Comparison between Example 1 and Example 2)

The optical substrate according to Example 1 and the optical substrate according to Example 2 both satisfy the straight line condition and the width condition. A major difference between the optical substrate according to Example 1 and the optical substrate according to Example 2 is that the standard deviation of the depth between a projection and a depression of the optical substrate according to Example 2 is about 1.5 times of the standard deviation of the depth between a projection and a depression of the optical substrate according to Example 1. Comparing the organic EL element using the optical substrate according to Example 1 and the organic EL element using the optical substrate according to Example 2, it was verified that the organic EL element using the optical substrate according to Example 2 having a larger standard deviation of the depth between a projection and a depression showed higher current efficiency.

The standard deviation of the depth between a projection and a depression is a value reflecting the depth of the projection-depression structure, and is a parameter having a larger value as the difference between a projection and a depression is larger. It is believed that because an optical substrate having a larger standard deviation of the depth between a projection and a depression has a larger difference between a projection and a depression, the effect as the diffraction grating was enhanced, and higher current efficiency was attained in Example 2 than in Example 1.

COMPARISON BETWEEN EXAMPLE 3 AND COMPARATIVE EXAMPLE 1

The optical substrate according to Example 3 has an average of the widths of the projection portion about 100 nm larger than those of the optical substrates according to Examples 1 and 2. The organic EL element using the optical substrate according to Example 3 satisfies the straight line condition and the width condition and had better results in view of both current efficiency and leak current than those of the organic EL element using the optical substrate according to Comparative Example 1. It was verified that even in such cases where the scale of the width of the projection portion was increased, higher current efficiency was attained as a result of satisfaction of the straight line condition and the width condition.

COMPARISON BETWEEN EXAMPLE 4 AND COMPARATIVE EXAMPLE 2

The optical substrate according to Example 4 and the optical substrate according to Comparative Example 2 have an average of the widths of the projection portion about 120 to 145 nm even larger than that of the optical substrate according to Example 3. Comparing the organic EL element using the optical substrate according to Example 4 and the organic EL element using the optical substrate according to Comparative Example 2, the organic EL element according to Example 4 showed higher current efficiency than that of the organic EL element according to Comparative Example 2. It was verified that even in such cases where the scale of the width of the projection portion was further increased, higher current efficiency was attained as a result of satisfaction of the straight line condition and the width condition. The leak current was smaller and better results were attained in the organic EL element according to Example 4 than in the organic EL element according to Comparative Example 2.

REFERENCE SIGNS LIST 1, 20, 30 . . . optical substrate, 2 . . . support substrate, 3 . . . projection-depression structure layer, 4 . . . undercoat material layer, 5 . . . film-shaped mold, 5a . . . substrate portion, 5b . . . projection-depression portion, 6 . . . pressurizing roll, 7 . . . release roll, 8 . . . metal mold, 8a . . . projection-depression portion, 9 . . . coating layer, 10 . . . first electrode, 11 . . . organic layer, 12 . . . second electrode, 13 . . . optical functional layer, 100, 200, 300 . . . organic EL element, La . . . length of outline, Lb . . . linear distance, X . . . outline.

The invention claimed is:
1. An optical substrate comprising:
a support substrate; and
a projection-depression structure layer on a surface of which shapes of projections and depressions are formed, the projection-depression structure layer being laminated on the support substrate,
wherein extending directions of projection portions included in the projection-depression structure layer are irregularly distributed when seen in planar view,
outlines seen in planar view of the projection portions include a plurality of sections each having a length of an average of widths of the projection portion multiplied by a factor of π, the widths being in directions approximately orthogonal to the extending directions of the projection portions seen in planar view, the plurality of sections including more straight line sections than curved line sections in a region per unit area of the projection-depression structure layer,
each curved line section is a section in which a ratio of a linear distance between both ends of the section to a length of an outline between both ends of the section is 0.75 or less,
each straight line section is a section which is not one of the curved line sections among the plurality of sections, and
a coefficient of variation of the widths of the projection portions is 0.25 or less.
2. The optical substrate according to claim 1,
wherein the widths of the projection portions are constant.
3. The optical substrate according to claim 1,
wherein in cases where an analyzed image of projections and depressions obtained through analysis of the shapes of projections and depressions formed on the surface of the projection-depression structure layer with a scanning probe microscope is subjected to two-dimensional high-speed Fourier transformation to obtain a Fourier transformed image, the Fourier transformed image shows a circular pattern or an annular pattern in which an origin having an absolute value of a wavenumber of 0 $\mu m^{-1}$ is approximately in the center, and the circular pattern or the annular pattern is present within a region having an absolute value of a wavenumber within the range of 10 $\mu m^{-1}$ or less.

4. The optical substrate according to claim 1,
wherein an average pitch of projections and depressions of the projection-depression structure layer is 100 to 1500 nm, and
a standard deviation of the depth between a projection and a depression of the projection-depression structure layer is 10 to 100 nm.

5. The optical substrate according to claim 1, further comprising:
an optical functional layer formed on a surface of the support substrate opposite to a surface of the support substrate on which the projection-depression structure layer is formed.

6. The optical substrate according to claim 1, further comprising:
a coating layer formed on the projection-depression structure layer.

7. A mold used in manufacturing of the optical substrate according to claim 1, wherein the mold includes a projection-depression portion in which a projection-depression pattern corresponding to shapes of projections and depressions to be formed on the projection-depression structure layer of the optical substrate is formed.

8. A light emitting element including the optical substrate according to claim 1,
wherein a first electrode, an organic layer which emits light, and a second electrode are sequentially laminated on the projection-depression structure layer.

* * * * *